United States Patent
Yamazaki et al.

(10) Patent No.: US 10,418,466 B2
(45) Date of Patent: *Sep. 17, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Takahiro Tsuji, Atsugi (JP); Kunihiko Suzuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/432,077

(22) Filed: Feb. 14, 2017

(65) Prior Publication Data
US 2017/0154983 A1  Jun. 1, 2017

Related U.S. Application Data

(63) Continuation of application No. 14/665,503, filed on Mar. 23, 2015, now Pat. No. 9,595,600, which is a
(Continued)

(30) Foreign Application Priority Data

Sep. 24, 2009  (JP) ................. 2009-218904

(51) Int. Cl.
*H01L 29/66* (2006.01)
*H01L 27/12* (2006.01)
(Continued)

(52) U.S. Cl.
CPC .. *H01L 29/66969* (2013.01); *H01L 21/02554* (2013.01); *H01L 21/02565* (2013.01);
(Continued)

(58) Field of Classification Search
CPC ........... H01L 29/7869–78693; H01L 27/3274
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Korean Office Action (Application No. 2012-7006780) dated Apr. 12, 2017.
(Continued)

*Primary Examiner* — Julia Slutsker
(74) *Attorney, Agent, or Firm* — Robinson Intellectual Property Law Office; Eric J. Robinson

(57) ABSTRACT

An object is to provide a high reliability thin film transistor using an oxide semiconductor layer which has stable electric characteristics. In the thin film transistor in which an oxide semiconductor layer is used, the amount of change in threshold voltage of the thin film transistor before and after a BT test is made to be 2 V or less, preferably 1.5 V or less, more preferably 1 V or less, whereby the semiconductor device which has high reliability and stable electric characteristics can be manufactured. In particular, in a display device which is one embodiment of the semiconductor device, a malfunction such as display unevenness due to change in threshold voltage can be reduced.

13 Claims, 31 Drawing Sheets

Related U.S. Application Data continuation of application No. 12/888,825, filed on Sep. 23, 2010, now Pat. No. 9,029,191.

(51) Int. Cl.
  *H01L 29/786* (2006.01)
  *H01L 21/66* (2006.01)
  *H01L 21/02* (2006.01)
  *H01L 29/04* (2006.01)

(52) U.S. Cl.
  CPC .. *H01L 21/02595* (2013.01); *H01L 21/02667* (2013.01); *H01L 22/14* (2013.01); *H01L 27/1225* (2013.01); *H01L 29/04* (2013.01); *H01L 29/66742* (2013.01); *H01L 29/7869* (2013.01); *H01L 29/78606* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,852,623 B2 | 2/2005 | Park et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al. |
| 7,277,152 B2 | 10/2007 | Sakamoto et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,888,207 B2 | 2/2011 | Wager, III et al. |
| 8,053,780 B2 | 11/2011 | Kanno et al. |
| 8,212,248 B2 | 7/2012 | Itagaki et al. |
| 8,384,077 B2 | 2/2013 | Yano et al. |
| 8,415,198 B2 | 4/2013 | Itagaki et al. |
| 8,563,977 B2 | 10/2013 | Shimada et al. |
| 8,704,217 B2 | 4/2014 | Yano et al. |
| 8,785,240 B2 | 7/2014 | Watanabe |
| 9,153,703 B2 | 10/2015 | Kaji et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2003/0234424 A1 | 12/2003 | Suzawa et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0121700 A1 | 6/2006 | Peng et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0263949 A1 | 11/2006 | Tsai et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0129933 A1 | 6/2008 | Nishida et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277663 A1 | 11/2008 | Kang et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159894 A1 | 6/2009 | Yasumatsu |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0025675 A1 | 2/2010 | Yamazaki et al. |
| 2010/0025678 A1 | 2/2010 | Yamazaki et al. |
| 2010/0035429 A1 | 2/2010 | Jang et al. |
| 2010/0065844 A1 | 3/2010 | Tokunaga |
| 2010/0065851 A1 | 3/2010 | Makita |
| 2010/0072468 A1 | 3/2010 | Yamazaki et al. |
| 2010/0072469 A1 | 3/2010 | Yamazaki et al. |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0213459 A1* | 8/2010 | Shimada ............ H01L 29/78606 257/43 |
| 2010/0276685 A1 | 11/2010 | Itagaki et al. |
| 2012/0132911 A1 | 5/2012 | Shimada et al. |

(56) References Cited

U.S. PATENT DOCUMENTS

| | | | | |
|---|---|---|---|---|
| 2012/0142131 A1* | 6/2012 | Takahashi | ............ | H01L 27/1225 438/34 |
| 2013/0146452 A1 | 6/2013 | Yano et al. | | |

FOREIGN PATENT DOCUMENTS

| | | | | |
|---|---|---|---|---|
| JP | 60-198861 A | 10/1985 | | |
| JP | 63-210022 A | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 05-251705 A | 9/1993 | | |
| JP | 08-264794 A | 10/1996 | | |
| JP | 11-040814 A | 2/1999 | | |
| JP | 11-505377 | 5/1999 | | |
| JP | 2000-044236 A | 2/2000 | | |
| JP | 2000-150900 A | 5/2000 | | |
| JP | 2002-076356 A | 3/2002 | | |
| JP | 2002-289859 A | 10/2002 | | |
| JP | 2003-005215 A | 1/2003 | | |
| JP | 2003-086000 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2006-502597 | 1/2006 | | |
| JP | 2007-096055 A | 4/2007 | | |
| JP | 2007-123861 A | 5/2007 | | |
| JP | 2007-311404 A | 11/2007 | | |
| JP | 2008-053356 A | 3/2008 | | |
| JP | 2008-218495 A | 9/2008 | | |
| JP | 2008-281988 A | 11/2008 | | |
| JP | 2008-311342 A | 12/2008 | | |
| JP | 2009-099944 A | 5/2009 | | |
| JP | 2009-164393 A | 7/2009 | | |
| JP | 2010-040552 A | 2/2010 | | |
| KR | 2004-0079516 A | 9/2004 | | |
| KR | 2008-0099084 A | 11/2008 | | |
| WO | WO-2004/038757 | 5/2004 | | |
| WO | WO-2004/114391 | 12/2004 | | |
| WO | WO-2008/023553 | 2/2008 | | |
| WO | WO-2008/105250 | 9/2008 | | |
| WO | WO-2008/126879 | 10/2008 | | |
| WO | WO-2009/031634 | 3/2009 | | |
| WO | WO-2009/041544 | 4/2009 | | |
| WO | WO 2009/041544 | * 4/2009 | ............ | H01L 29/786 |
| WO | WO-2009/075281 | 6/2009 | | |
| WO | WO-2009/087943 | 7/2009 | | |
| WO | WO-20091091013 | 7/2009 | | |

OTHER PUBLICATIONS

International Search Report (Application No. PCT/JP2010/066615) dated Oct. 26, 2010.
Written Opinion (Application No. PCT/JP2010/066615) dated Oct. 26, 2010.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kitzerow.H et al., "Observation of Blue Phases in Chiral Networks", Liquid Crystals, 1993, vol. 14, No. 3, pp. 911-916.
Nakamura.M, "Synthesis of Homologous Compound with New Long-Period Structure", NIRIM Newsletter, Mar. 1, 1995, vol. 150, pp. 1-4.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 28, pp. 262106-1-262106-3.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Kurokawa.Y et al., "UHF RFCPUS on Flexible and Glass Substrates for Secure RFID Systems", Journal of Solid-State Circuits , 2008, vol. 43, No. 1, pp. 292-299.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65,2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Kikuchi.H et al., "62.2:Invited Paper:Fast Electro-Optical Switching in Polymer-Stabilized Liquid Crystalline Blue-Phases for Display Application", SID Digest '07 : SID International Symposium Digest of Technical Papers, 2007, vol. 38, pp. 1737-1740.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Kikuchi.H et al., "Polymer-Stabilized Liquid Crystal Blue Phases", Nature Materials, Sep. 2, 2002, vol. 1, pp. 64-68.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Orita.M et al., "Amorphous transparent conductive oxide $InGaO_3(ZnO)_m$ (m<4):a $Zn4s$ conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst, Solids (Journal of Non-Crystalline Solids), 1996, vol. 198-200, pp. 165-169.
Clark.S et al., "First Principles Methods Using CASTEP", Zeitschrift fur Kristallographie, 2005, vol. 220, pp. 567-570.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Lee.H et al., "Current Status of, Challenges to, and Perspective View of AM-OLED", IDW '06 : Proceedings of the 13th International Display Workshops, Dec. 7, 2006, pp. 663-666.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Dehuff.N et al., "Transparent thin-film transistors with zinc indium oxide channel layer", J. Appl. Phys. (Journal of Applied Physics), 2005, vol. 97, pp. 064505-1-064505-5.
Honda.S et al., "Oxygen content of indium tin oxide films fabricated by reactive sputtering", J. Vac. Sci. Technol. A (Journal of Vacuum Science & Technology A), 1995, pp. 1100-1103.
Takeda.K et al., "Thermal annealing effects of dangling bonds in hydrogenated polymorphous silicon", J. Appl. Phys. (Journal of Applied Physics, 2008, vol. 104, pp. 053715-1-053715-6.
Korean Office Action (Application No. 2012-7006829) dated Jun. 5, 2013.

\* cited by examiner

FIG. 5A1
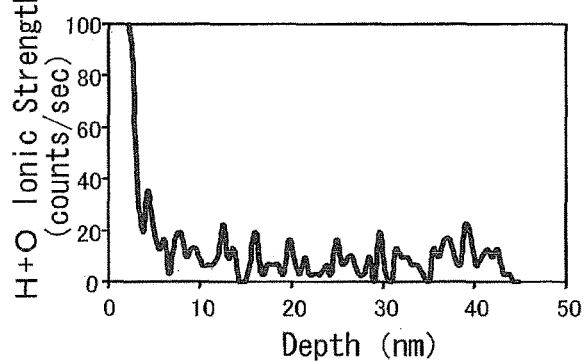
FIG. 5A2
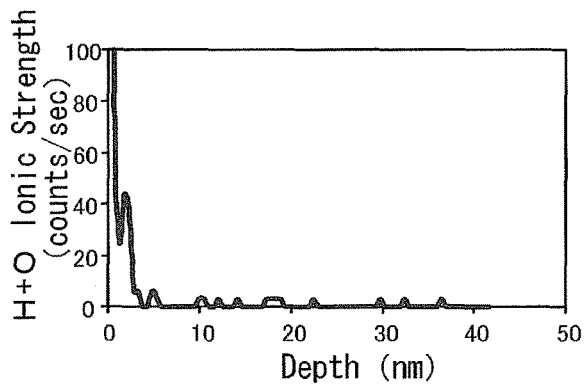
FIG. 5B1
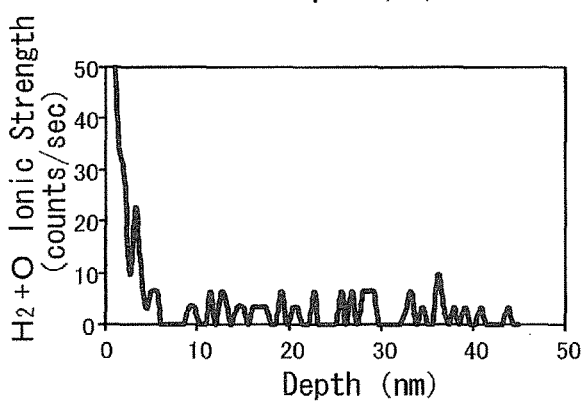
FIG. 5B2
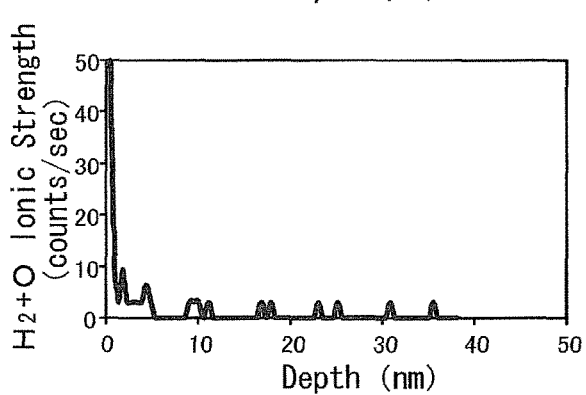

FIG. 6A  FIG. 6B  FIG. 6C  FIG. 6D
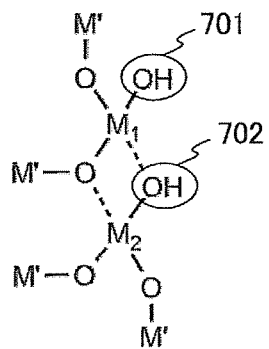
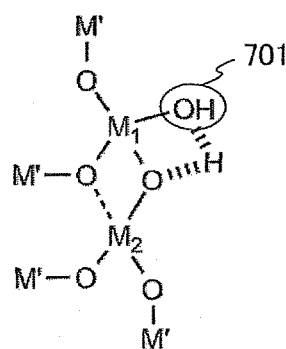
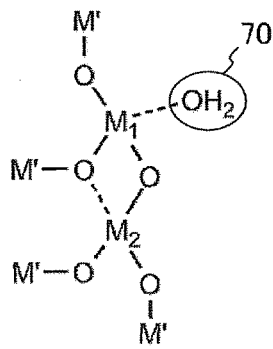
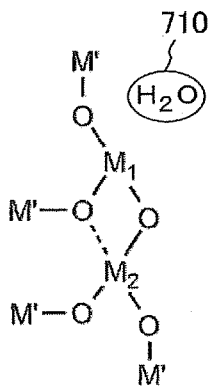
FIG. 6E
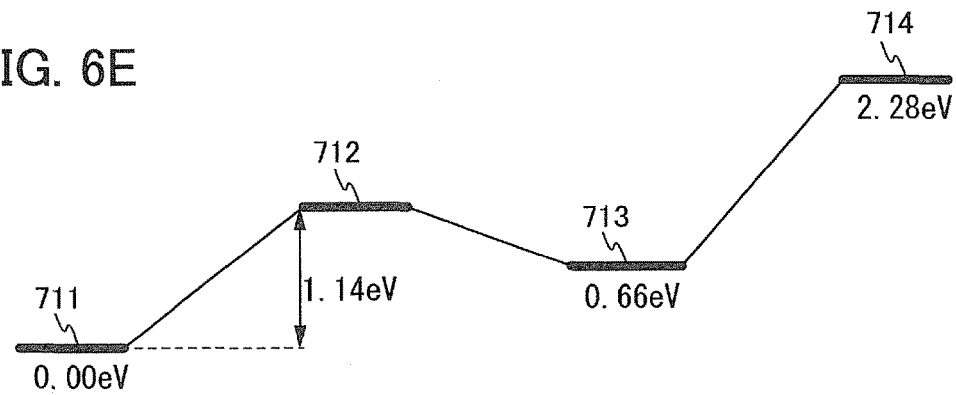
FIG. 6F
| M1-M2 | In-Ga | In-In | Ga-Ga | In-Zn | Ga-Zn | Zn-Zn |
|---|---|---|---|---|---|---|
| Ea | 1.14eV | 1.16eV | 1.25eV | 1.35eV | 1.40eV | 1.98eV |

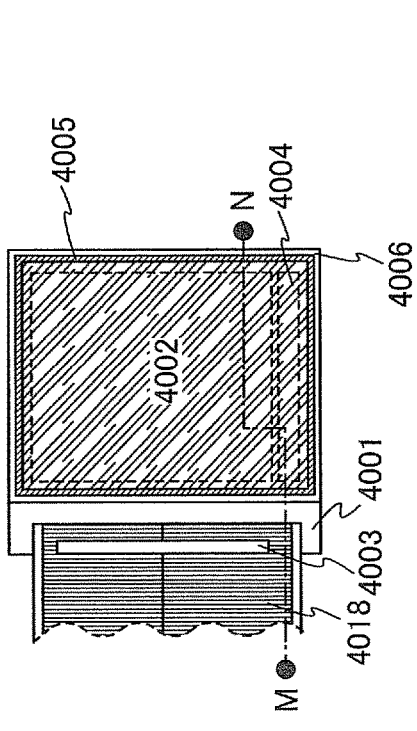
FIG. 11A1
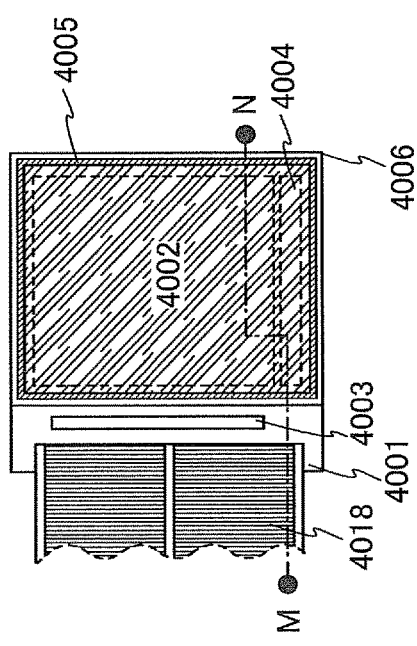
FIG. 11A2
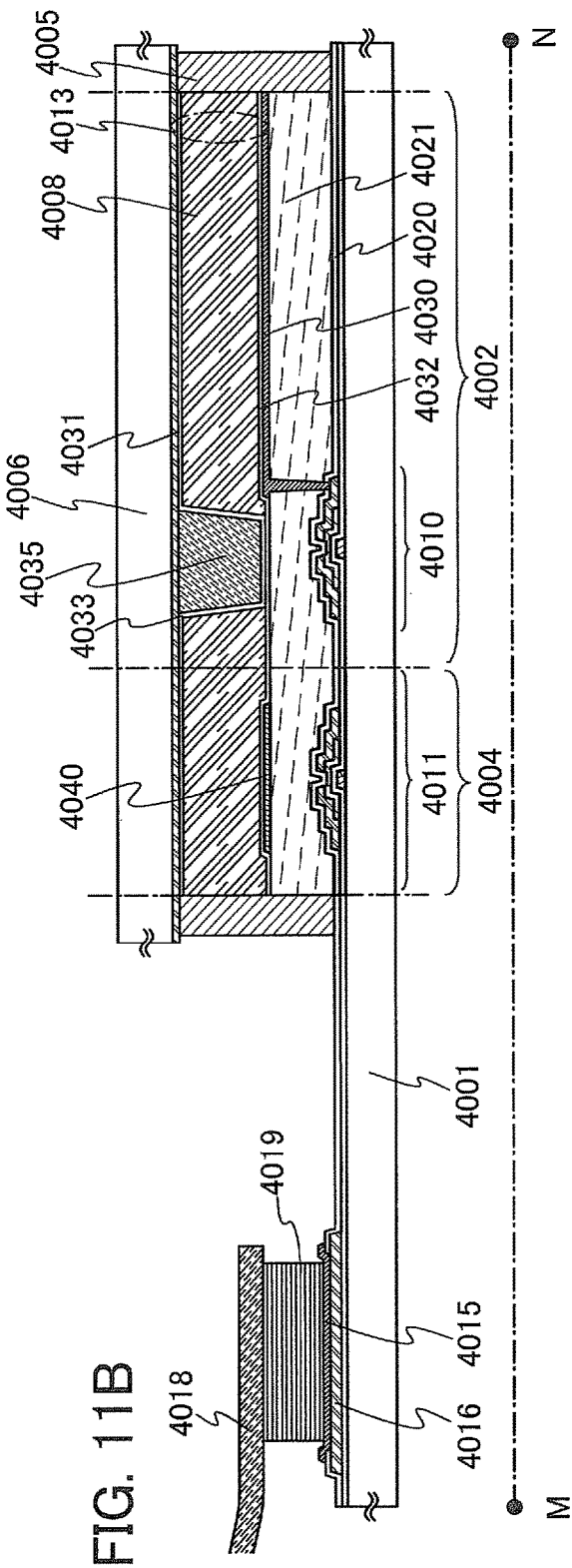
FIG. 11B

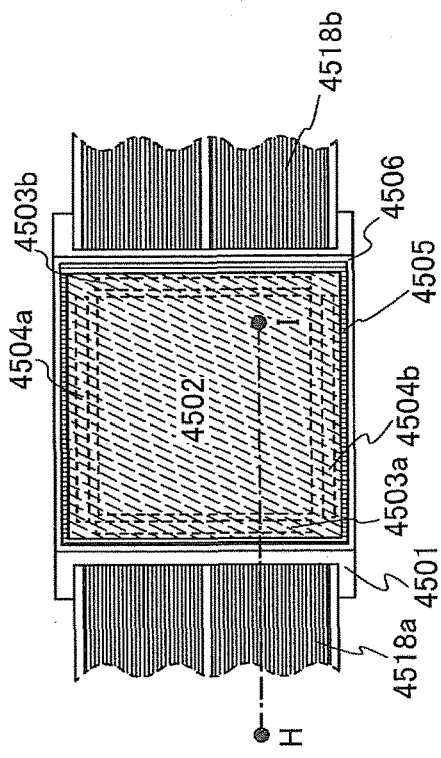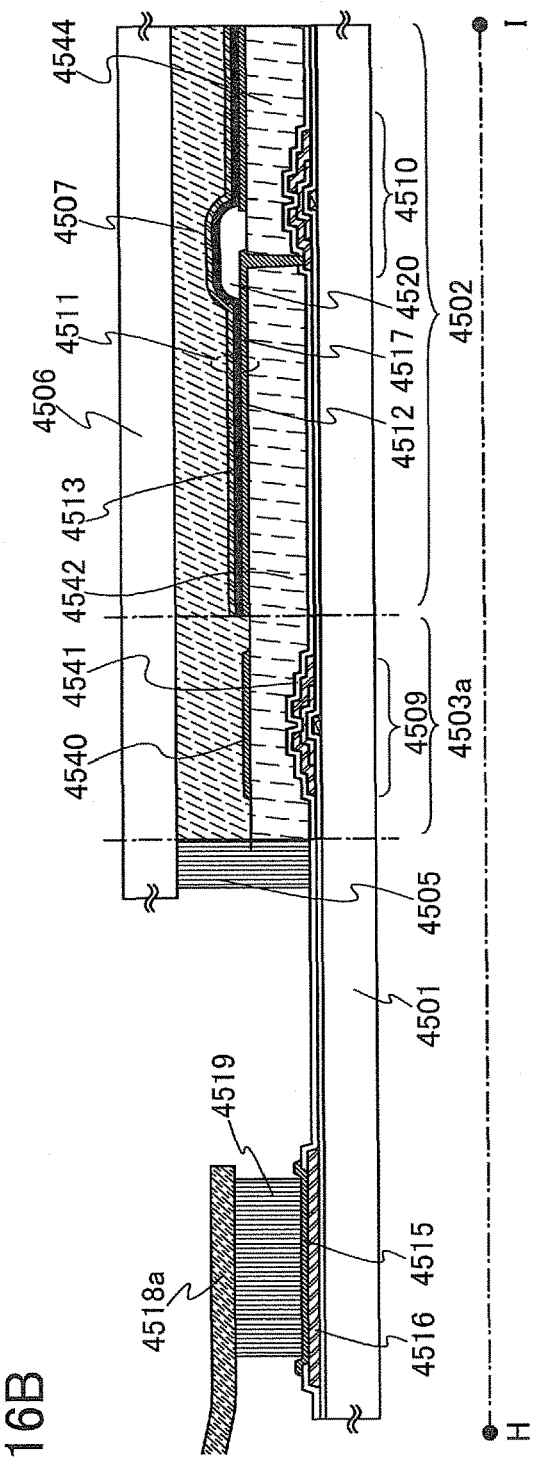
FIG. 16A
FIG. 16B

SEMICONDUCTOR DEVICE AND METHOD FOR MANUFACTURING THE SAME

TECHNICAL FIELD

The present invention relates to a semiconductor device including an oxide semiconductor and a method for manufacturing the semiconductor device.

Note that in this specification, a semiconductor device refers to all devices that can function by utilizing semiconductor properties, and electro-optical devices, semiconductor circuits, and electronic devices are all semiconductor devices.

BACKGROUND ART

In recent years, a technique by which a thin film transistor (TFT) is manufactured using a semiconductor thin layer (with a thickness of about several nanometers to several hundreds of nanometers) formed over a substrate having an insulating surface has attracted attention. Thin film transistors are applied to a wide range of electronic devices such as ICs or electro-optical devices, and prompt development of thin film transistors to be used especially as switching elements in image display devices is being pushed. Various metal oxides are used for a variety of applications. Indium oxide is a well-known material and is used as a transparent electrode material which is needed for liquid crystal displays and the like.

Some metal oxides have semiconductor properties. The examples of such a metal oxide having semiconductor properties are tungsten oxide, tin oxide, indium oxide, zinc oxide, and the like. A thin film transistor in which a channel formation region is formed using such a metal oxide having semiconductor properties is already known (Patent Documents 1 and 2).

REFERENCE

[Patent Document 1] Japanese Published Patent Application No. 2007-123861
[Patent Document 2] Japanese Published Patent Application No. 2007-96055

DISCLOSURE OF INVENTION

The electron field effect mobility of a thin film transistor in which a channel formation region is provided in an oxide semiconductor is higher than that of a thin film transistor in which amorphous silicon is used.

Such an oxide semiconductor is expected to be used for manufacturing thin film transistors on a glass substrate, a plastic substrate, or the like, and to be applied to display devices such as a liquid crystal display, an electroluminescent display device, and electronic paper.

In an active-matrix display device, electric characteristics of thin film transistors included in a circuit are important and the performance of the display device depends on the electric characteristics of the thin film transistors. Among electric characteristics of thin film transistors, threshold voltage ($V_{th}$) is particularly important. When the threshold voltage is high or negative even when the field effect mobility is high, it is difficult to control the circuit. In the case where a thin film transistor has high threshold voltage and a high absolute value of the threshold voltage, the thin film transistor cannot perform a switching function and might be a load when it is driven at low voltage. Further, in the case where the threshold voltage is negative, current tends to flow between a source electrode and a drain electrode even if the gate voltage is 0 V, that is, the thin film transistor tends to be in a so-called normally-on state.

In the case of an n-channel thin film transistor, it is preferable that a channel be formed and drain current flow only after positive voltage is applied as gate voltage. A transistor in which a channel is not formed unless the driving voltage is increased and a transistor in which a channel is formed and drain current flows even in the case of a negative voltage state are unsuitable for a thin film transistor used in a circuit.

In the case where variation (the amount of change) in the characteristics of transistors included in a circuit in a semiconductor device is large, a malfunction due to variation in threshold voltage might be caused.

In particular, in a liquid crystal display device, in the case where threshold voltage greatly varies between elements, a malfunction such as display unevenness due to the variation in threshold voltage might be caused.

Further, also in a display device including a light-emitting element, in the case where on current ($I_{on}$) of TFTs (TFTs in a driver circuit or TFTs for supplying current to light-emitting elements arranged in pixels) which are arranged so as to make constant current flow to a pixel electrode greatly varies, a malfunction such as variation in luminance on a display screen might be caused.

It is an object of one embodiment of the present invention to provide a thin film transistor which operates stably for a long time and a semiconductor device in which the thin film transistor is used.

One embodiment of the present invention disclosed in this specification is a semiconductor device. The semiconductor device includes a gate electrode layer over a substrate having an insulating surface; a gate insulating layer over the gate electrode layer; an oxide semiconductor layer over the gate insulating layer; a source and drain electrode layers over the oxide semiconductor layer; and an insulating layer in contact with part of the oxide semiconductor layer, over the gate insulating layer, the oxide semiconductor layer, and the source and drain electrode layers.

One embodiment of the present invention disclosed in this specification is a method for manufacturing a semiconductor device. The method includes the steps of forming a gate electrode layer over a substrate having an insulating surface; forming a gate insulating layer over the gate electrode layer; forming an oxide semiconductor layer over the gate insulating layer; performing first heat treatment after the formation of the oxide semiconductor layer; forming a source and drain electrode layers over the oxide semiconductor layer; forming an insulating layer in contact with part of the oxide semiconductor layer, over the gate insulating layer, the oxide semiconductor layer, and the source and drain electrode layers; and performing second heat treatment after the formation of the insulating layer.

Note that the first heat treatment is preferably performed in a nitrogen atmosphere or a rare gas atmosphere. In addition, the first heat treatment is preferably performed under a condition that the highest temperature in the treatment is higher than or equal to 350° C. and lower than or equal to 750° C. Note that the temperature of a so-called overshoot portion which is generated at the time of temperature control is not included as the highest temperature in this specification.

The second heat treatment is preferably performed in an air atmosphere, an oxygen atmosphere, a nitrogen atmosphere, or a rare gas atmosphere. In addition, the second heat treatment is preferably performed at a temperature higher than or equal to 100° C. and lower than or equal to the maximum temperature of the first heat treatment.

With the above structure, at least one of the objects is achieved.

An oxide semiconductor used in this specification is formed into a thin film represented by $InMO_3(ZnO)_m$ (m>0), and a thin film transistor is manufactured using this thin film as an oxide semiconductor layer. Note that m is not always an integer. Note that M denotes one metal element or a plurality of metal elements selected from Ga, Fe, Ni, Mn, and Co. As an example, M may be Ga or may include the above metal element in addition to Ga, for example, M may be Ga and Ni, or Ga and Fe. Moreover, in the above oxide semiconductor, in some cases, a transition metal element such as Fe or Ni or an oxide of the transition metal is contained as an impurity element in addition to a metal element contained as M. In this specification, among the oxide semiconductor layers whose composition formulae are represented by $InMO_3(ZnO)_m$ (m>0), an oxide semiconductor whose composition formula includes Ga as M is referred to as an In—Ga—Zn—O-based oxide semiconductor, and a thin film of the In—Ga—Zn—O-based oxide semiconductor is referred to as an In—Ga—Zn—O-based non-single-crystal layer.

Besides the above, the following oxide semiconductors can be used for the oxide semiconductor layer: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—Ga—O-based oxide semiconductor; an In—O-based oxide semiconductor; a Sn—O-based oxide semiconductor; and a Zn—O-based oxide semiconductor. Silicon oxide may be contained in the oxide semiconductor layer. Addition of silicon oxide ($SiO_x$ (x>0)) which hinders crystallization into the oxide semiconductor layer can suppress crystallization of the oxide semiconductor layer at the time when heat treatment is performed after the formation of the oxide semiconductor layer in the manufacturing process. Note that the oxide semiconductor layer is preferably amorphous but may be partly crystallized.

The oxide semiconductor preferably contains In, and further preferably contains In and Ga. In order to obtain an I-type (intrinsic) oxide semiconductor layer, dehydration or dehydrogenation is effective.

Depending on the conditions of the heat treatment or the material of the oxide semiconductor, the state of the oxide semiconductor layer is changed from an amorphous state to a microcrystalline state or a polycrystalline state. Even when the state of the oxide semiconductor layer is changed to a microcrystalline state or a polycrystalline state, switching characteristics as a TFT can be obtained.

A thin film transistor having small variation in threshold voltage and electric characteristics which are stable for a long time can be provided. Thus, a semiconductor device which includes highly reliable thin film transistors having favorable electric characteristics can be provided.

BRIEF DESCRIPTION OF DRAWINGS

In the accompanying drawings:

FIGS. 5A1 and 5A2 show HO ionic strength of oxide semiconductor layers, and FIGS. 5B1 and 5B2 show $H_2O$ ionic strength of the oxide semiconductor layers;

FIGS. 6A to 6F show analysis results of a mechanism in which a water molecule is eliminated from an oxide semiconductor;

FIGS. 11A1, 11A2, and 11B illustrate a semiconductor device;

FIGS. 16A and 16B illustrate a semiconductor device;

BEST MODE FOR CARRYING OUT THE INVENTION

Figure 1A:
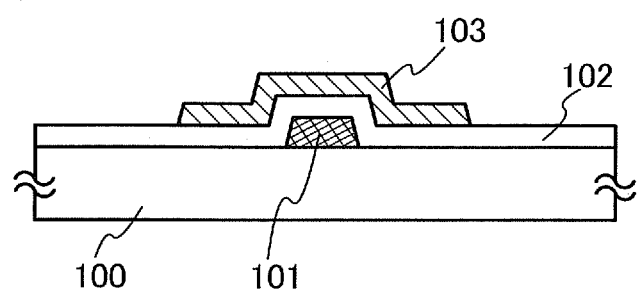
FIGS. 1A to 1D illustrate manufacturing steps of a semiconductor device.

Hereinafter, Embodiments and Example of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. Therefore, the present invention is not construed as being limited to the description of Embodiments and Example.

Embodiment 1

In this embodiment, one embodiment of a method for manufacturing a thin film transistor 150 illustrated in FIG. 1D will be described with reference to FIGS. 1A to 1D that are cross-sectional views illustrating manufacturing steps of the thin film transistor. The thin film transistor 150 has a bottom-gate structure called a channel-etched structure.

First, over a substrate 100 having an insulating surface, a gate electrode layer 101 is provided through a photolithography process with the use of a photomask. Note that a resist mask may be formed by an inkjet method. Formation of the resist mask by an inkjet method needs no photomask, which results in a reduction in manufacturing costs.

It is preferable that a glass substrate be used as the substrate 100. In the case where the temperature of heat treatment performed later is high, a glass substrate having a strain point of 730° C. or higher is preferably used as the substrate 100. Further, as a material of the substrate 100, for example, a glass material such as aluminosilicate glass, aluminoborosilicate glass, or barium borosilicate glass is used. Note that when the glass substrate contains more barium oxide (BaO) than boron oxide ($B_2O_3$), more practical heat-resistant glass can be obtained. Thus, a glass substrate containing BaO and $B_2O_3$ in which the amount of BaO is larger than that of $B_2O_3$ is preferably used.

Note that a substrate formed of an insulator, such as a ceramic substrate, a quartz glass substrate, a quartz substrate, or a sapphire substrate, may be used instead of the substrate 100. Besides, crystallized glass or the like may be used.

An insulating layer serving as a base layer may be provided between the substrate 100 and the gate electrode layer 101. The base layer has a function of preventing diffusion of an impurity element from the substrate 100, and can be formed to have a single-layer structure or a stacked-layer structure including one or more of a silicon nitride layer, a silicon oxide layer, a silicon nitride oxide layer, and a silicon oxynitride layer.

When a halogen element such as chlorine or fluorine is contained in the base layer, a function of preventing diffusion of an impurity element from the substrate 100 can be further improved. The peak of the concentration of a halogen element to be contained in the base layer is measured by secondary ion mass spectrometry (SIMS) and is preferably in the range of $1\times10^{15}$ cm$^{-3}$ to $1\times10^{20}$ cm$^{-3}$.

A metal conductive layer can be used as the gate electrode layer 101. As a material of the metal conductive layer, the following is preferably used: an element selected from aluminum (Al), chromium (Cr), copper (Cu), tantalum (Ta), titanium (Ti), molybdenum (Mo), and tungsten (W), an alloy containing the above element, an alloy containing these elements in combination, or the like. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure, a two-layer structure, or a structure in which four or more layers are stacked.

Then, a gate insulating layer 102 is formed over the gate electrode layer 101.

The gate insulating layer 102 can be formed to have a single layer of a silicon oxide layer, a silicon nitride layer, a silicon oxynitride layer, or a silicon nitride oxide layer or a stacked layer thereof by a plasma CVD method, a sputtering method, or the like. For example, a silicon oxynitride layer may be formed by a plasma CVD method using $SiH_4$, oxygen, and nitrogen as deposition gases. The thickness of the gate insulating layer 102 is set to 100 nm to 500 nm inclusive. In the case where the gate insulating layer 102 has a stacked-layer structure, for example, the stacked-layer structure includes a first gate insulating layer with a thickness of 50 nm to 200 nm inclusive and a second gate insulating layer with a thickness of 5 nm to 300 nm inclusive over the first gate insulating layer.

Before the formation of the oxide semiconductor layer, heat treatment (at higher than or equal to 400° C. and lower than the strain point of the substrate) may be performed in an inert gas atmosphere (e.g., nitrogen, helium, neon, or argon) so that impurities such as hydrogen and water contained in the gate insulating layer 102 are removed.

Then, over the gate insulating layer 102, an oxide semiconductor layer is formed to a thickness of 5 nm to 200 nm inclusive, preferably 10 nm to 50 nm inclusive. In order to be amorphous even after heat treatment for dehydration or dehydrogenation which follows the formation of the oxide semiconductor layer, the oxide semiconductor layer preferably has a small thickness of less than or equal to 50 nm. The small thickness of the oxide semiconductor layer makes it possible to prevent the oxide semiconductor film layer being crystallized when heat treatment is performed after the formation of the oxide semiconductor layer.

The oxide semiconductor layer is formed using an In—Ga—Zn—O-based non-single-crystal layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Zn—O-based oxide semiconductor layer, a Sn—Zn—O-based oxide semiconductor layer, an Al—Zn—O-based oxide semiconductor layer, an In—Ga—O-based oxide semiconductor layer, an In—O-based oxide semiconductor layer, a Sn—O-based oxide semiconductor layer, or a Zn—O-based oxide semiconductor layer. For example, in this embodiment, the oxide semiconductor layer is formed using an In—Ga—Zn—O based oxide semiconductor target by a sputtering method. Alternatively, the oxide semiconductor layer 130 can be formed by a sputtering method in a rare gas (typically argon) atmosphere, an oxygen atmosphere, or an atmosphere including a rare gas (typically argon) and oxygen. In the case where a sputtering method is used, it is preferable that film formation be performed with a target containing $SiO_2$ at 2 wt % to 10 wt % inclusive so that $SiO_x$ (x>0) which inhibits crystallization is contained in the oxide semiconductor layer to prevent the oxide semiconductor layer from being crystallized in heat treatment performed later for dehydration or dehydrogenation. Note that a pulsed direct-current (DC) power source is preferably used, in which case dust can be reduced and the thickness distribution can be uniform.

Further, the relative density of the oxide semiconductor in the oxide semiconductor target is preferably greater than or equal to 80%, in which case the concentration of impurities in the formed oxide semiconductor layer can be reduced, which leads to excellent electric characteristics and high reliability of a thin film transistor.

Examples of a sputtering method include an RF sputtering method in which a high-frequency power source is used as a sputtering power source, a DC sputtering method, and a pulsed DC sputtering method in which a bias is applied in a pulsed manner. The RF sputtering method is mainly used for forming an insulating layer, and the DC sputtering method is mainly used for forming a metal layer.

In addition, there is also a multi-source sputtering apparatus in which a plurality of targets of different materials can be set. With the multi-source sputtering apparatus, different materials can be deposited to be stacked in one chamber, or plural kinds of materials can be deposited by electric discharge at the same time in one chamber.

In addition, there are a sputtering apparatus provided with a magnet system inside the chamber and used for a magnetron sputtering method, and a sputtering apparatus used for an ECR sputtering method in which plasma generated using microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is applied also to a substrate during deposition.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the deposition chamber is heated to a temperature of 200° C. to 600° C. inclusive under reduced pressure, a method in which introduction and exhaust of nitrogen or an inert gas are repeated while the inside of the deposition chamber is heated, and the like can be given. In this case, not water but oil or the like is preferably used as a coolant for the target. Although a certain level of effect can be obtained when introduction and exhaust of nitrogen are repeated without heating the deposition chamber, it is more preferable to perform the treatment with the inside of the deposition chamber heated. After the preheat treatment, the substrate or the sputtering apparatus is cooled, and then the oxide semiconductor film is formed.

The substrate may be heated to a temperature of higher than or equal to 400° C. and lower than or equal to 700° C. during the formation of the oxide semiconductor film by a sputtering method.

It is preferable to remove moisture or the like remaining in the sputtering apparatus with the use of a cryopump before, during, or after the formation of the oxide semiconductor film.

The gate insulating layer 102 and the oxide semiconductor film may be formed successively without exposure to air. Successive film formation without exposure to air makes it possible to obtain each interface between stacked layers, which is not contaminated by atmospheric components or impurity elements floating in air, such as water, hydrocarbon, or the like. Thus, variation in characteristics of thin film transistors can be reduced.

Then, the oxide semiconductor layer is processed into an island-shaped oxide semiconductor layer 103 through a photolithography process (see FIG. 1A). Alternatively, a resist mask for forming the island-shaped oxide semiconductor layer 103 may be formed by an inkjet method. Formation of the resist mask by an inkjet method needs no photomask, which results in a reduction in manufacturing costs.

Then, first heat treatment is performed to dehydrate or dehydrogenate the oxide semiconductor layer 103. The temperature of the first heat treatment for dehydration or dehydrogenation is set to 350° C. to 750° C. inclusive, preferably 425° C. or higher. Note that in the case where the temperature is 425° C. or higher, the heat treatment time may be one hour or shorter, whereas in the case where the temperature is lower than 425° C., the heat treatment time is set to longer than one hour. For example, the substrate is put in an electric furnace that is a kind of heat treatment apparatus, the heat treatment is performed on the oxide semiconductor layer in a nitrogen atmosphere, and then water or hydrogen is prevented from being mixed into the oxide semiconductor layer with the oxide semiconductor layer not exposed to air; thus, the oxide semiconductor layer 103 can be obtained. In this embodiment, slow cooling is performed in one furnace in a nitrogen atmosphere from a heating temperature T at which dehydration or dehydrogenation is performed on the oxide semiconductor layer 103 to a temperature low enough to prevent entry of water; specifically, the slow cooling is performed until the temperature drops by 100° C. or more from the heating temperature T. The atmosphere is not limited to a nitrogen atmosphere, and the dehydration or dehydrogenation may be performed in a rare gas atmosphere (e.g., helium, neon, or argon).

Through the first heat treatment, rearrangement at the atomic level occurs in the oxide semiconductor included in the oxide semiconductor layer 103. The first heat treatment is important because the first heat temperature can reduce distortion which hinders transfer of carriers in the oxide semiconductor layer 103.

In the first heat treatment, it is preferable that water, hydrogen, and the like be not contained in nitrogen or a rare gas such as helium, neon, or argon. It is preferable that the purity of nitrogen or a rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

The first heat treatment can be performed by a heating method using an electric furnace. Note that in the first heat treatment, the heat treatment apparatus is not limited to an electric furnace and may be provided with a device that heats an object to be processed by thermal conduction or thermal radiation from a heater such as a resistance heater. For example, a rapid thermal anneal (RTA) apparatus such as a gas rapid thermal anneal (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, like nitrogen or a rare gas such as argon, is used.

In some cases, the oxide semiconductor layers might be crystallized to be a microcrystalline layer or a polycrystalline layer depending on the conditions of the first heat treatment or the material of the oxide semiconductor layer. For example, the oxide semiconductor layer might be crystallized to be a microcrystalline semiconductor having a degree of crystallization of 80% or more, or 90% or more. Depending on the material of the oxide semiconductor layer, the oxide semiconductor layer might be an oxide semiconductor layer containing no crystal.

The first heat treatment can be performed before processing the oxide semiconductor film into the island-shaped oxide semiconductor layer 103. In that case, the substrate is taken out of the heating apparatus after the first heat treatment, and then a photolithography process is performed.

Figure 4A:
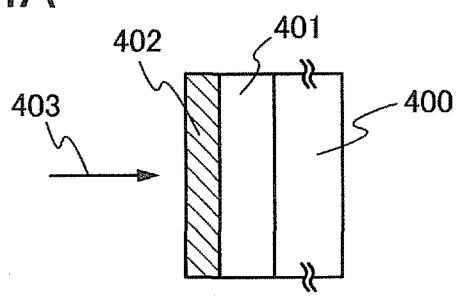
FIGS. 4A and 4B illustrate the concentration of hydrogen in oxide semiconductor layers.

Here, analysis of the concentration of hydrogen in an oxide semiconductor layer which was dehydrogenated and an oxide semiconductor layer which was not dehydrogenated are described. FIG. 4A is a cross-sectional schematic view of a sample used in this analysis. The prepared sample was formed as follows: an oxynitride insulating layer 401 was formed over a glass substrate 400 by a plasma CVD method, and an In—Ga—Zn—O-based oxide semiconductor layer 402 was formed to a thickness of about 40 nm over the oxynitride insulating layer 401. The prepared sample was divided into two pieces: one of the two was not dehydrogenated and the other one was dehydrogenated at 650° C. for 6 minutes in a nitrogen atmosphere by a GRTA method. The concentration of hydrogen in the oxide semiconductor layer of each sample was measured so that the effect of dehydrogenation by heat treatment was examined.

Figure 4B:
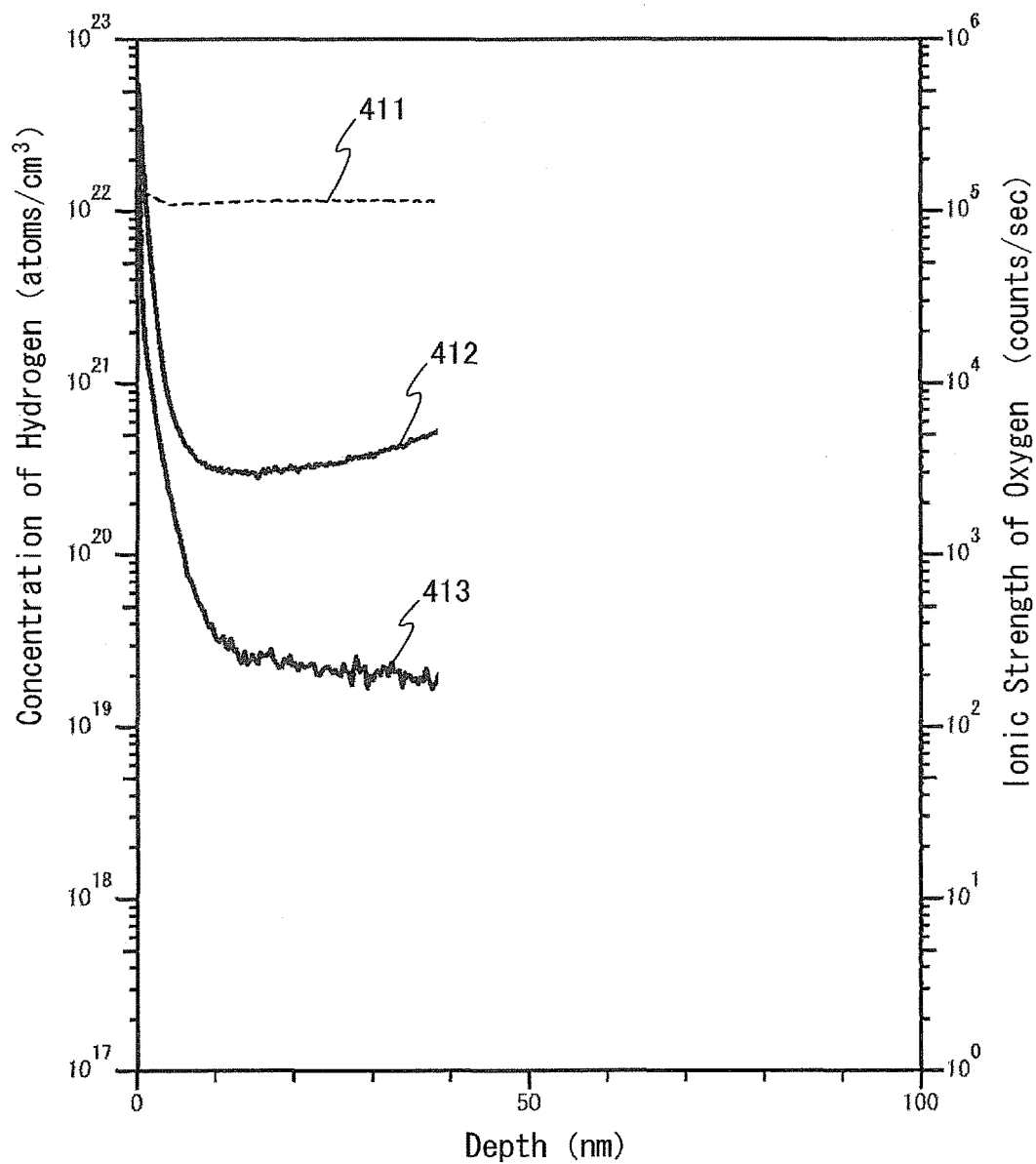

The concentration of hydrogen in each oxide semiconductor layer was measured by secondary ion mass spectrometry (SIMS). FIG. 4B shows the results of analysis by SIMS of the concentration distribution of hydrogen in the oxide semiconductor layers in the thickness direction. The horizontal axis represents depth from surfaces of the samples, and the point at the left end where the depth is 0 nm corresponds to the outermost surfaces of the samples (the outermost surfaces of the oxide semiconductor layers). An analysis direction 403 shown in FIG. 4A represents the analysis direction of the SIMS analysis. The analysis was performed in a direction from the outermost surface of each oxide semiconductor layer to the glass substrate 400, that is, in a direction from the left end to the right end of the horizontal axis in FIG. 4B. The vertical axes of FIG. 4B are logarithmic axes representing hydrogen concentration and ionic strength of oxygen at a certain depth of each sample.

In FIG. 4B, a hydrogen concentration profile 412 is a profile of the concentration of hydrogen in the oxide semiconductor layer which was not dehydrogenated, and a hydrogen concentration profile 413 is a profile of the concentration of hydrogen in the oxide semiconductor layer which was dehydrogenated by heat treatment. An oxygen ionic strength profile 411 shows oxygen ionic strength which was obtained in the measurement of the hydrogen concentration profile 412. The oxygen ionic strength profile 411 was not drastically changed and substantially constant, which means that the SIMS analysis was performed with precision. Although not shown, oxygen ionic strength was measured also in the measurement of the hydrogen concentration profile 413 in a manner similar to that of the oxygen ionic strength profile 411 and the oxygen ionic strength was also substantially constant. The hydrogen concentration profile 412 and the hydrogen concentration profile 413 were quantified with the use of a reference sample formed using an In—Ga—Zn—O-based oxide semiconductor layer similarly to the samples.

Note that it is known that it is difficult, in principle, to obtain correct data in the proximity of a surface of a sample or in the proximity of an interface between stacked layers formed using different materials by the SIMS analysis. It is thought that correct data could not be obtained from the outermost surface of the samples to a depth of about 15 nm in this analysis; thus, the profiles at a depth of 15 nm or more were evaluated.

The hydrogen concentration profile 412 shows that hydrogen was contained in the oxide semiconductor layer which was not dehydrogenated at approximately $3 \times 10^{20}$ atoms/cm$^3$ to approximately $5 \times 10^{20}$ atoms/cm$^3$ and at an average hydrogen concentration of approximately $4 \times 10^{20}$ atoms/cm$^3$. In addition, hydrogen concentration profile 413 shows that the average hydrogen concentration in the oxide semiconductor layer could be reduced to approximately $2 \times 10^{19}$ atoms/cm$^3$ by dehydrogenation.

The analysis confirmed that dehydrogenation by heat treatment allows the concentration of hydrogen in the oxide semiconductor layer to be reduced. The analysis also confirmed that dehydrogenation at 650° C. for 6 minutes in a nitrogen atmosphere by a GRTA method allows the concentration of hydrogen in the oxide semiconductor layer to be reduced one tenth or less.

Figure 1B:
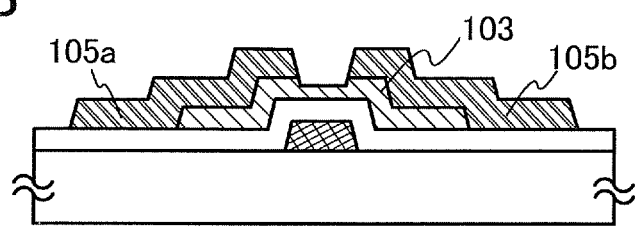
Figure 1C:
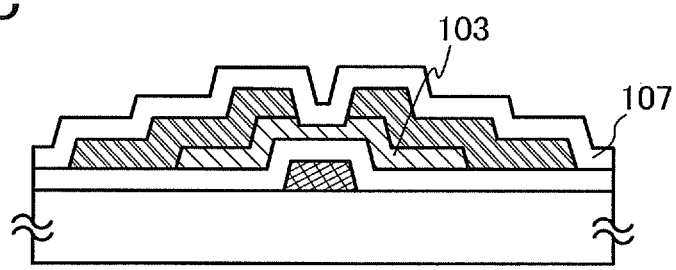
Figure 1D:
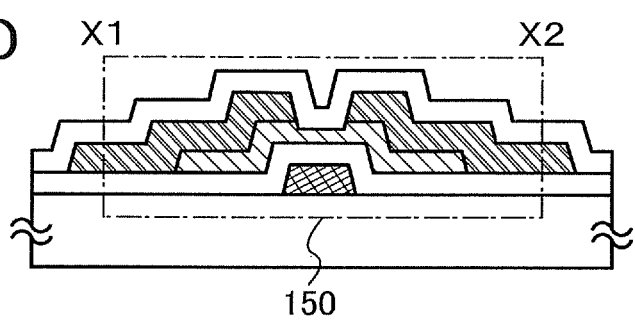
Figure 2:
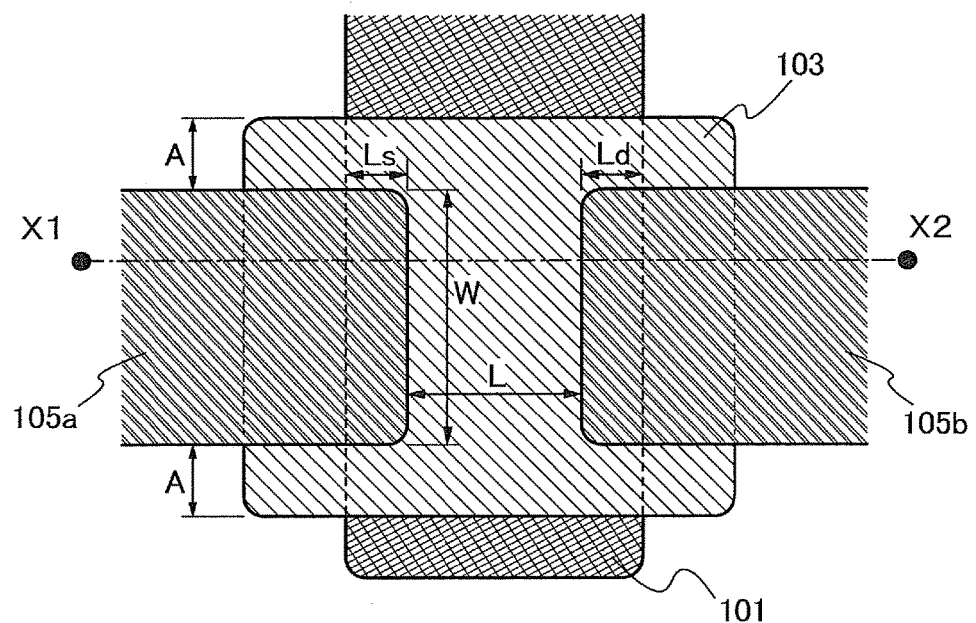
FIG. 2 illustrates a semiconductor device.

FIGS. 5A1 and 5A2 each show H+O ionic strength measured at the same time as the SIMS analysis shown in FIG. 4B, and FIGS. 5B1 and 5B2 each show $H_2$+O ionic strength measured at the same time as the SIMS analysis shown in FIG. 4B. FIG. 5A1 shows the H+O ionic strength of the oxide semiconductor layer which was not dehydrogenated, and FIG. 5A2 shows the H+O ionic strength of the oxide semiconductor layer which was dehydrogenated. FIG. 5B1 shows the $H_2$+O ionic strength of the oxide semiconductor layer which was not dehydrogenated, and FIG. 5B2 shows the $H_2$+O ionic strength of the oxide semiconductor layer which was dehydrogenated. It is found that the samples which were dehydrogenated had lower H+O ionic strength and $H_2$+O ionic strength than the samples which were not dehydrogenated and that elimination of moisture or OH was efficiently performed by the heat treatment at 650° C. for 6 minutes by a GRTA method.

Next, FIGS. 6A to 6F show results of computational chemistry analysis of a mechanism in which a water molecule is eliminated from the In—Ga—Zn—O-based oxide semiconductor. A quantum chemistry calculation program Gaussian 03 was used for the analysis. In the oxide semiconductor, as well as a water molecule, OH and H might be eliminated as a water molecule with OH and H combined with each other; therefore, the elimination mechanism of an OH group existing in the oxide semiconductor was analyzed.

FIG. 6A shows an initial state of a most stable structure in the oxide semiconductor including OH groups, and FIG. 6D shows a final state where the OH groups become a water molecule (an $H_2O$ molecule) to be eliminated to infinity. FIGS. 6B and 6C show a transition state and an intermediate state before reaching the state shown in FIG. 6D from the state shown in FIG. 6A. Symbols $M_1$, $M_2$, and M' denote metal atoms corresponding to In, Ga, and Zn. In other words, there are six combinations of $M_1$ and $M_2$: In and In, Ga and Ga, Zn and Zn, In and Ga, In and Zn, and Ga and Zn. Note that the calculation was performed with M' replaced by a hydrogen atom on the smallest molecule structure basis. The step-by-step description on the elimination mechanism of the OH group is given below.

First, in the initial state, an OH group 701 is combined with $M_1$, and an OH group 702 forms a coordinate bond so as to cross-link $M_1$ to $M_2$ (see FIG. 6A).

Next, when energy of a given amount or more is applied to the oxide semiconductor, H in the OH group 702 is dislocated to the OH group 701 (see FIG. 6B) and an $H_2O$ molecule 705 is generated. The $H_2O$ molecule 705 forms a coordinate bond with $M_1$ (see FIG. 6C). Finally, the $H_2O$ molecule 705 becomes an $H_2O$ molecule 710 which is eliminated from $M_1$ to infinity (see FIG. 6D).

FIG. 6E shows values of potential energy of the states shown in FIGS. 6A to 6D in the case where the combination of $M_1$ and $M_2$ is In and Ga. Energy 711 represents energy of the state shown in FIG. 6A. Energy 712 represents energy of the state shown in FIG. 6B. Energy 713 represents energy of the state shown in FIG. 6C. Energy 714 represents energy of the state shown in FIG. 6D.

The analysis results show that the activation energy for generating a water molecule in the case where the combination of $M_1$ and $M_2$ was In and Ga was 1.14 eV. FIG. 6F shows calculation results of the activation energy (Ea) for generating a water molecule in the case of the six combinations of $M_1$ and $M_2$. It was found that among the six combinations of $M_1$ and $M_2$, the activation energy in the case of the combination of In and Ga was lowest and the activation energy in the case of the combination of Zn and Zn was highest. The activation energy tends to increase when Zn is included in the combination of $M_1$ and $M_2$; therefore, Zn might be a hindrance to elimination of the OH group in the In—Ga—Zn—O-based oxide semiconductor.

The analysis results show that the content (the number of atoms) of In and the content (the number of atoms) of Ga are preferably substantially the same or the content of In is preferably larger than that of Ga for efficient elimination of the OH group in the In—Ga—Zn—O-based oxide semiconductor by heat treatment. In addition, the analysis results show that the content (the number of atoms) of Zn is preferably smaller than the sum of the content of In and the content of Ga and that Zn is more preferably smaller than each content of In and Ga.

The composition of the oxide semiconductor is optimized, whereby dehydration or dehydrogenation by heat treatment can be performed efficiently.

Then, a conductive layer for forming a source and drain electrode layers is formed over the gate insulating layer 102 and the oxide semiconductor layer 103.

The conductive layer for forming a source and drain electrode layers can be formed using a metal conductive layer in a manner similar to that of the gate electrode layer 101. As the material of the metal conductive layer, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure, a two-layer structure, or a structure in which four or more layers are stacked.

In a photolithography process, with the use of a photomask, a source electrode layer 105a and a drain electrode layer 105b are formed using the conductive layer for forming a source and drain electrode layers (see FIG. 1B). At this time, part of the oxide semiconductor layer 103 is also etched, whereby the oxide semiconductor layer 103 having a groove (depression) is formed.

Note that a resist mask used for forming the source electrode layer 105a and the drain electrode layer 105b may be formed by an inkjet method. Formation of the resist mask by an inkjet method needs no photomask, which results in a reduction in manufacturing costs.

An oxide conductive layer which has lower resistance than the oxide semiconductor layer 103 may be formed between the oxide semiconductor layer 103 and the source electrode layer 105a and the drain electrode layer 105b. Such a stacked-layer structure makes it possible to increase the withstand voltage of the thin film transistor. Specifically, the concentration of carriers in the oxide conductive layer having lower resistance is preferably in the range of, for example, $1\times10^{20}/cm^3$ to $1\times10^{21}/cm^3$.

Then, an insulating layer 107 which covers the gate insulating layer 102, the oxide semiconductor layer 103, the source electrode layer 105a, and the drain electrode layer 105b and which is in contact with part of the oxide semiconductor layer 103 is formed (see FIG. 1C). The insulating layer 107 can be formed to a thickness of at least 1 nm or more by a method by which impurities such as water and hydrogen are prevented from being mixed into the insulating layer 107, such as a CVD method or a sputtering method, as appropriate. Here, the insulating layer 107 is formed by, for example, a reactive sputtering method that is a kind of sputtering method. The insulating layer 107 which is in contact with part of the oxide semiconductor layer 103 does not contain impurities such as moisture, hydrogen ions, and $OH^-$, and is formed using an inorganic insulating layer which prevents entry of those impurities from the outside. The insulating layer 107 can be formed using, typically, a silicon oxide layer, a silicon nitride oxide layer, a silicon nitride layer, an aluminum oxide layer, or an aluminum oxynitride layer.

The insulating layer 107 may have a structure in which a silicon nitride layer or an aluminum nitride layer is stacked over a silicon oxide layer, a silicon nitride oxide layer, an aluminum oxide layer, or an aluminum oxynitride layer. In particular, the silicon nitride layer is preferable because it does not contain impurities such as moisture, hydrogen ions, or $OH^-$ and prevents entry of these impurities from the outside.

The substrate temperature at the time of the formation of the insulating layer 107 is preferably higher than or equal to room temperature and lower than or equal to 300° C. A silicon oxide layer can be formed by a sputtering method in a rare gas (typically argon) atmosphere, an oxygen atmosphere, or an atmosphere containing a rare gas (typically argon) and oxygen. As a target, a silicon oxide target or a silicon target can be used. For example, silicon oxide can be deposited using a silicon target in an atmosphere containing oxygen and a rare gas by a sputtering method.

Then, second heat treatment is performed. The second heat treatment is performed at a temperature higher than or equal to 100° C. and lower than or equal to the highest temperature in the first heat treatment. For example, the substrate is put in an electric furnace which is a kind of heat treatment apparatus and heat treatment is performed in a nitrogen atmosphere. The second heat treatment may be performed anytime as long as it is performed after the formation of the insulating layer 107.

Through the above-described steps, the channel-etched thin film transistor 150 can be manufactured in which the gate electrode layer 101 is provided over the substrate 100 having an insulating surface, the gate insulating layer 102 is provided over the gate electrode layer 101, the oxide semiconductor layer 103 is provided over the gate insulating layer 102, the source electrode layer 105a and the drain electrode layer 105b are provided over the oxide semiconductor layer 103, and the insulating layer 107 which covers the gate insulating layer 102, the oxide semiconductor layer 103, the source electrode layer 105a, and the drain electrode layer 105b and is in contact with part of the oxide semiconductor layer 103 is provided.

FIG. 2 is a top view of the thin film transistor 150 described in this embodiment. FIG. 1D illustrates a cross-sectional structure of a portion taken along line X1-X2 in FIG. 2. In FIG. 2, L denotes channel length; W, channel width; A, the length of a region where the oxide semiconductor layer 103 does not overlap with the source electrode layer 105a and the drain electrode layer 105b in a direction parallel to a channel width direction; Ls, the length of a region where the source electrode layer 105a and the gate electrode layer 101 overlap with each other; and Ld, the length of a region where the drain electrode layer 105b and the gate electrode layer 101 overlap with each other.

Although the thin film transistor 150 is described as a single-gate thin film transistor in this embodiment, the thin film transistor 150 can be, as needed, a multi-gate thin film transistor including a plurality of channel formation regions or a thin film transistor in which a second gate electrode layer is provided over the insulating layer 107.

Figure 3A:
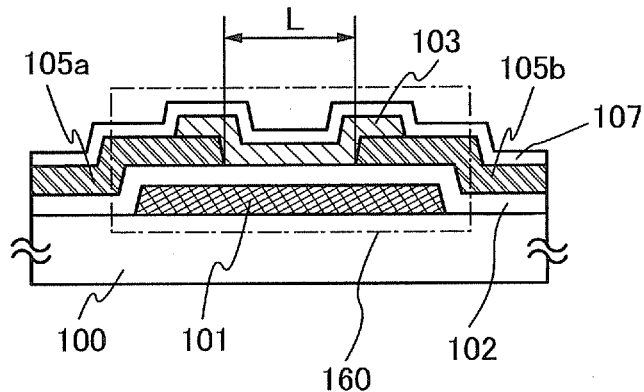
FIGS. 3A to 3C illustrate semiconductor devices.
Figure 3B:
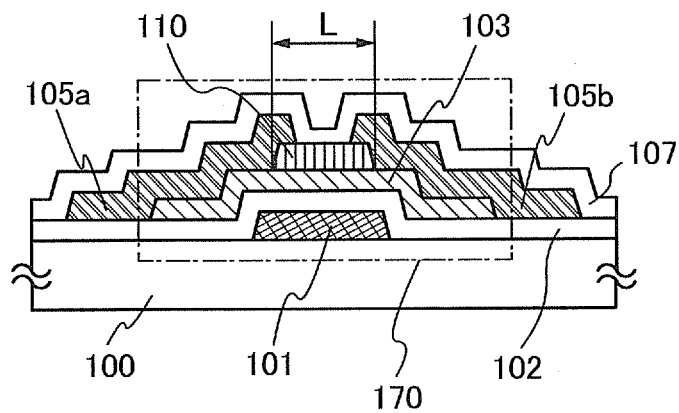
Figure 3C:
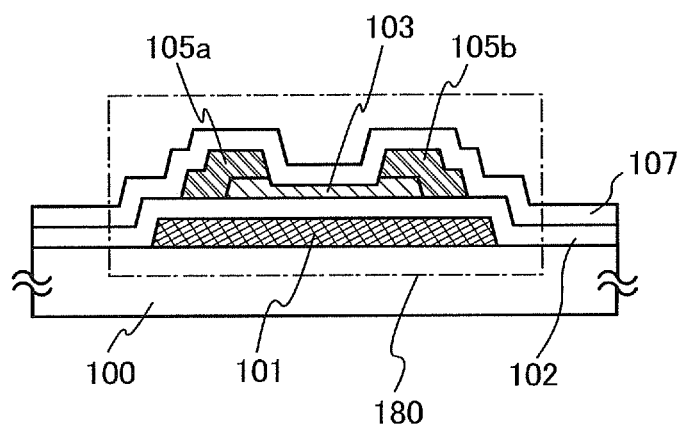

Further, although the method for manufacturing the channel-etched thin film transistor 150 is described in this embodiment, this embodiment is not limited thereto. A bottom-gate thin film transistor (also referred to as an inverted coplanar thin film transistor) 160 illustrated in FIG. 3A, a channel protective thin film transistor (also referred to as a channel stop thin film transistor) 170 including a channel protective layer 110 illustrated in FIG. 3B, or the like can be manufactured using a material and a method which are similar to those of the channel-etched thin film transistor 150. FIG. 3C illustrates another example of a channel-etched thin film transistor. A thin film transistor 180 illustrated in FIG. 3C has a structure in which the outer side edges of the gate electrode layer 101 extend beyond the outer side edges of the oxide semiconductor layer 103.

Note that the channel length (L in FIG. 2) of the thin film transistor is defined by a distance between the source electrode layer 105a and the drain electrode layer 105b, whereas the channel length of the channel protective thin film transistor is defined by the width of the channel protective layer in a direction parallel to a direction in which carriers flow.

In accordance with this embodiment, the threshold voltage of a thin film transistor in which an oxide semiconductor is used for a channel formation region can be made closer to 0 V.

Further, a thin film transistor including an oxide semiconductor layer, where the amount of change in threshold voltage before and after a BT test performed under conditions of a processing temperature of 150° C., a processing time of one hour, and an electric field intensity of $2 \times 10^6$ V/cm is less than or equal to 2 V, preferably less than or equal to 1.5 V, more preferably less than or equal to 1 V can be manufactured.

This embodiment can be implemented in appropriate combination with any of the structures described in the other embodiments.

Embodiment 2

In this embodiment, an example will be described below in which thin film transistors which are placed in a pixel portion and at least some of driver circuits are formed over one substrate.

The thin film transistor placed in the pixel portion is formed in accordance with Embodiment 1. Since the thin film transistor described in Embodiment 1 is an n-channel TFT, some of driver circuits that can be constituted by n-channel TFTs among the driver circuits are formed over a substrate over which the thin film transistor in the pixel portion is formed.

Figure 7A:
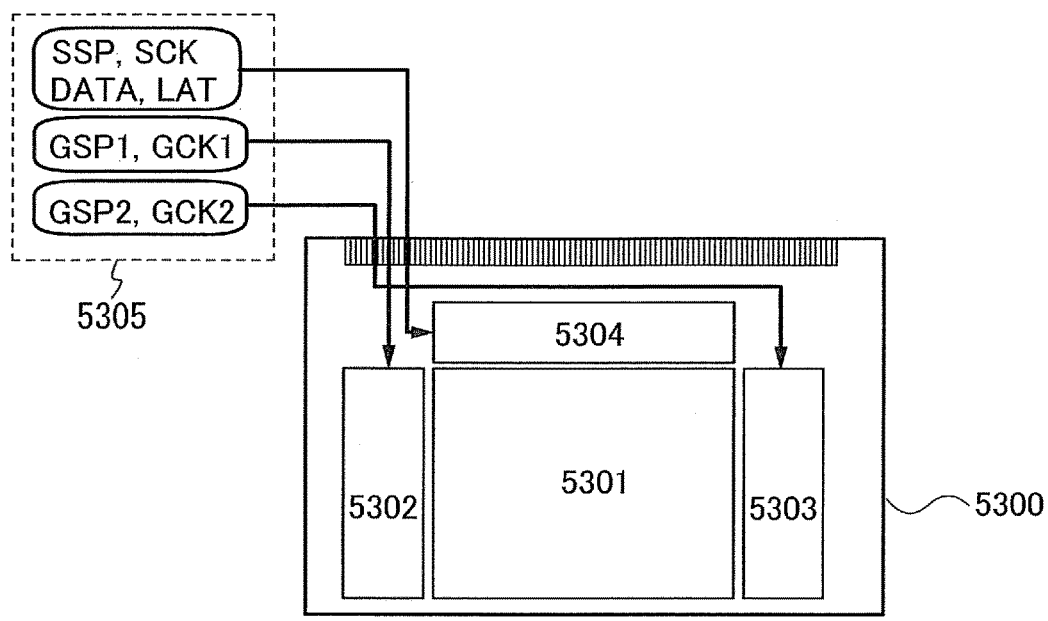
FIGS. 7A and 7B are block diagrams of a semiconductor device.

FIG. 7A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each including a display element are arranged in matrix in respective regions where the scan lines and the signal lines intersect with each other. The substrate 5300 of the display device is connected to a timing control circuit 5305 (also referred to as a controller or a control IC) through a connection portion such as a flexible printed circuit (FPC).

In FIG. 7A, the first scan line driver circuit 5302, the second scan line driver circuit 5303, and the signal line driver circuit 5304 are formed over the substrate 5300 where the pixel portion 5301 is formed. Thus, the number of components of a driver circuit and the like that are externally provided is reduced, which results in a reduction in costs. Moreover, the number of connections in the connection portion in the case where wirings are extended from a driver circuit provided outside the substrate 5300 can be reduced, and the reliability or yield can be improved.

Note that the timing control circuit 5305 supplies, for example, a first scan line driver circuit start signal (GSP1) (also referred to as a start pulse) and a scan line driver circuit clock signal (GCK1) to the first scan line driver circuit 5302. Furthermore, the timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 7B:
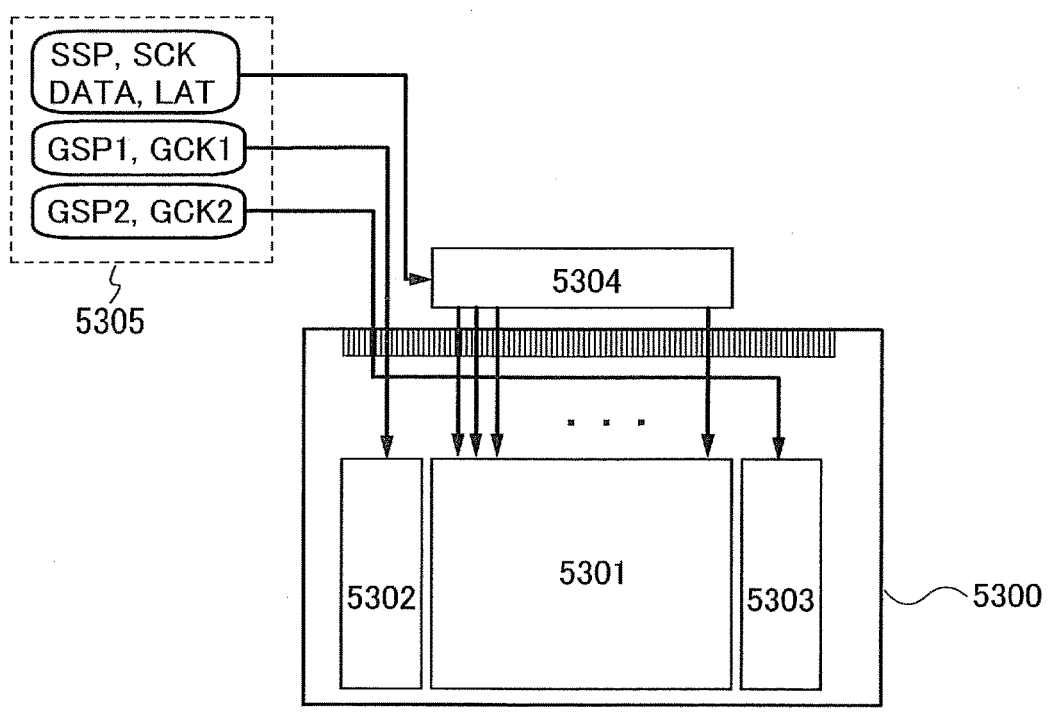

FIG. 7B illustrates a structure in which circuits with lower driving frequency (e.g., the first scan line driver circuit 5302 and the second scan line driver circuit 5303) are formed over the substrate 5300 where the pixel portion 5301 is formed and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, an increase in the size of the display device, a reduction in the number of steps, a reduction in costs, an improvement in yield, or the like can be achieved.

Figure 8A:
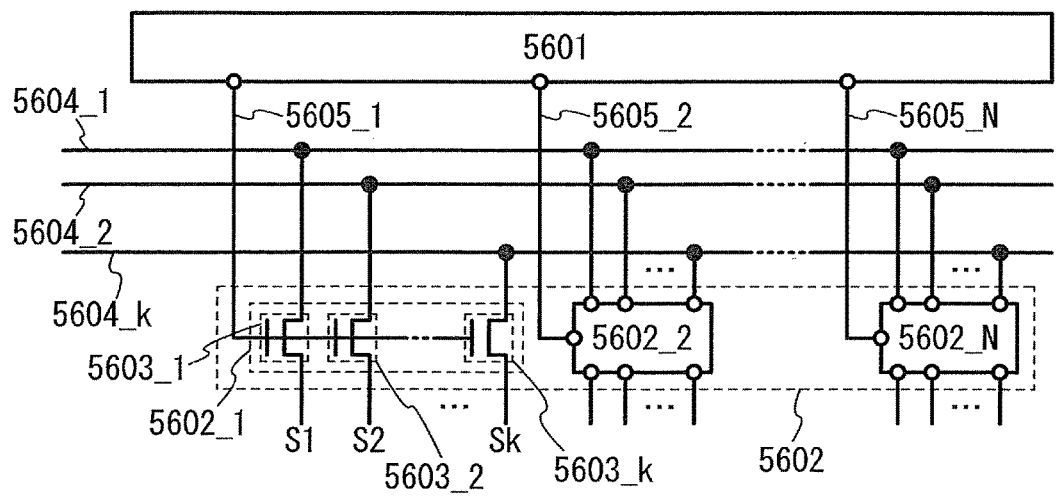
FIGS. 8A and 8B are a circuit diagram of a signal line driver circuit and a timing chart, respectively.
Figure 8B:
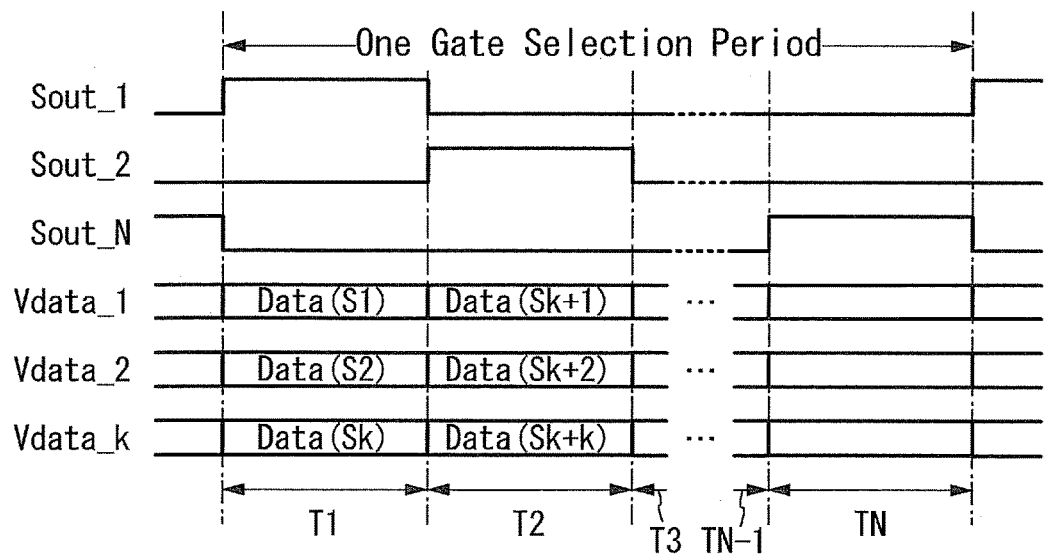

The thin film transistor described in Embodiment 1 is an n-channel TFT. FIGS. 8A and 8B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). An example in which the thin film transistors 5603_1 to 5603_k are n-channel TFTs is described below.

A connection relation in the signal line driver circuit is described using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at high power supply potential level) to wirings 5605_1 to 5605_N.

The switching circuit 5602_1 has a function of controlling a conduction state between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. In this manner, the switching circuit 5602_1 functions as a selector. Moreover, the thin film transistors 5603_1 to 5603_k have a function of controlling a conduction state between the wirings 5604_1 to 5604_k and the signal lines S1 to Sk, respectively, that is, a function of supplying potentials of the wirings 5604_1 to 5604_k are supplied to the signal lines S1 to Sk, respectively. In this manner, each of the thin film transistors 5603_1 to 5603_k functions as a switch.

The video signal data (DATA) is input to each of the wirings 5604_1 to 5604_k. The video signal data (DATA) is often an analog signal corresponding to an image signal or image data.

Next, the operation of the signal line driver circuit in FIG. 8A will be described with reference to a timing chart of FIG. 8B. FIG. 8B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawing and the like.

In the periods T1 to TN, the shift register 5601 sequentially outputs an H-level signals to the wirings 5605_1 to 5605_N. For example, in the period T1, the shift register 5601 outputs an H-level signal to the wiring 5605_1. Then, the thin film transistors 5603_1 to 5603_k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in a selected row through the thin film transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that the circuit constituted by the thin film transistor in Embodiment 1 can be used for the shift register 5601 and the switching circuit 5602. In that case, the shift register 5601 can be constituted by only n-channel transistors or only p-channel transistors.

One embodiment of a shift register which is used for part of the scan line driver circuit and/or the signal line driver circuit will be described with reference to FIGS. 9A to 9D and FIGS. 10A and 10B.

The scan line driver circuit includes a shift register. The scan line driver circuit may additionally include a level shifter, a buffer, or the like in some cases. In the scan line driver circuit, a clock signal (CK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to a scan line. Since the transistors in the pixels of one line have to be turned on all at once, a buffer that can supply a large current is used.

Figure 9A:
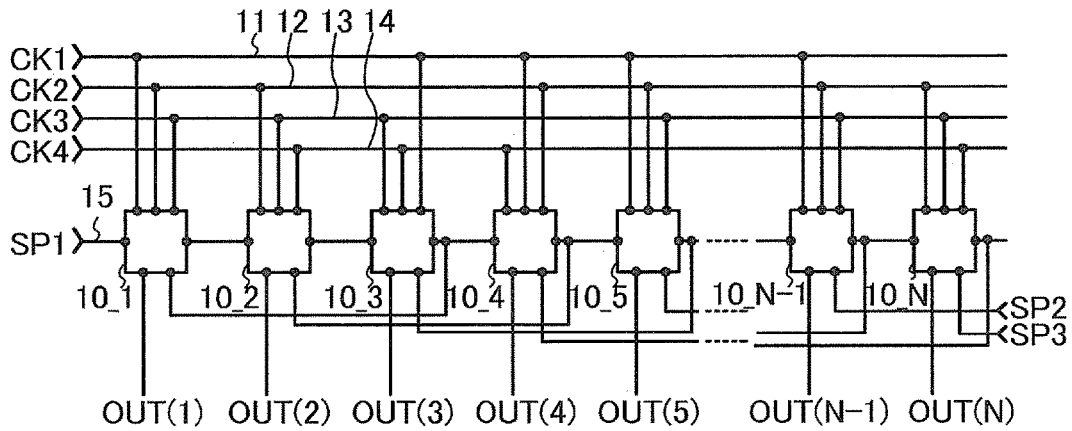
FIGS. 9A to 9D are circuit diagrams of a structure of a shift register.

The shift register includes a first to Nth pulse output circuits 10_1 to 10_N (N is a natural number greater than or equal to 3) (see FIG. 9A). In the shift register illustrated in FIG. 9A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n (n is a natural number greater than or equal to 2 and less than or equal to N) in the second or later stage, a signal from the pulse output circuit in the preceding stage (such a signal is referred to as a preceding-stage signal OUT(n−1)) (n is a natural number greater than or equal to 2) is input. A signal from the third pulse output circuit 10_3 in the stage that is two stages after the first pulse output circuit 10_1 is also input to the first pulse output circuit 10_1. In a similar manner, a signal from the (n+2)th pulse output circuit 10_(n+2) in the stage that is two stages after the nth pulse output circuit 10_n (such a signal is referred to as a later-stage signal OUT(n+2)) is input to the nth pulse output circuit 10_n in the second or later stage. Thus, the pulse output circuits in the respective stages output first output signals (OUT(1)(SR) to OUT (N)(SR)) to be input to the pulse output circuits in the respective subsequent stages and/or the pulse output circuits in the stages that are two stages before the respective pulse output circuits and second output signals (OUT(1) to OUT (N)) to be input to other circuits or the like. Note that as illustrated in FIG. 9A, since the later-stage signal OUT(n+2) is not input to the pulse output circuits in the last two stages of the shift register, for example, a second start pulse SP2 and a third start pulse SP3 may be additionally input to the respective pulse output circuits.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially (i.e., they are 90° out of phase with each other). In this embodiment, driving of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 9A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 9B:
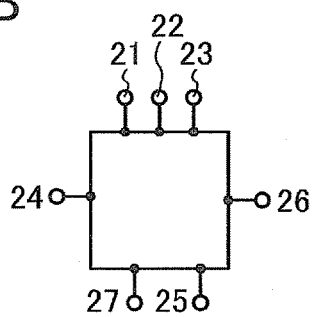

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 9B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a later-stage signal OUT(3) is input to the fifth input terminal 25; the first output signal OUT(1)(SR) is output from the first output terminal 26; and the second output signal OUT(1) is output from the second output terminal 27.

Figure 9C:
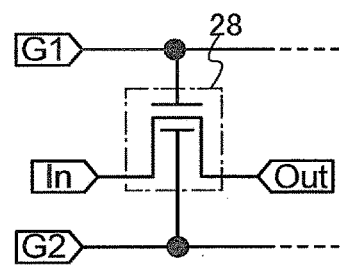

In the first to Nth pulse output circuits 10_1 to 10_N, a thin film transistor having four terminals can be used as well as a thin film transistor having three terminals. The thin film transistor having four terminals includes a source electrode, a drain electrode, a first gate electrode, and a second gate electrode, where a channel formation region of an oxide semiconductor layer is provided between the first and second gate electrodes with insulating layers interposed between the first and second gate electrodes. FIG. 9C illustrates the symbol of a thin film transistor 28 having four terminals and the symbol is used in drawings or the like below. The thin film transistor 28 can control electric current between an IN terminal and an OUT terminal with a first control signal G1 which is input to a first gate electrode and a second control signal G2 which is input to a second gate electrode.

Further, the threshold voltage of the thin film transistor 28 illustrated in FIG. 9C can be controlled to be a desired level by control of the potential of the first gate electrode or the potential of the second gate electrode.

Next, an example of a specific circuit configuration of the pulse output circuit will be described with reference to FIG. 9D.

Figure 9D:
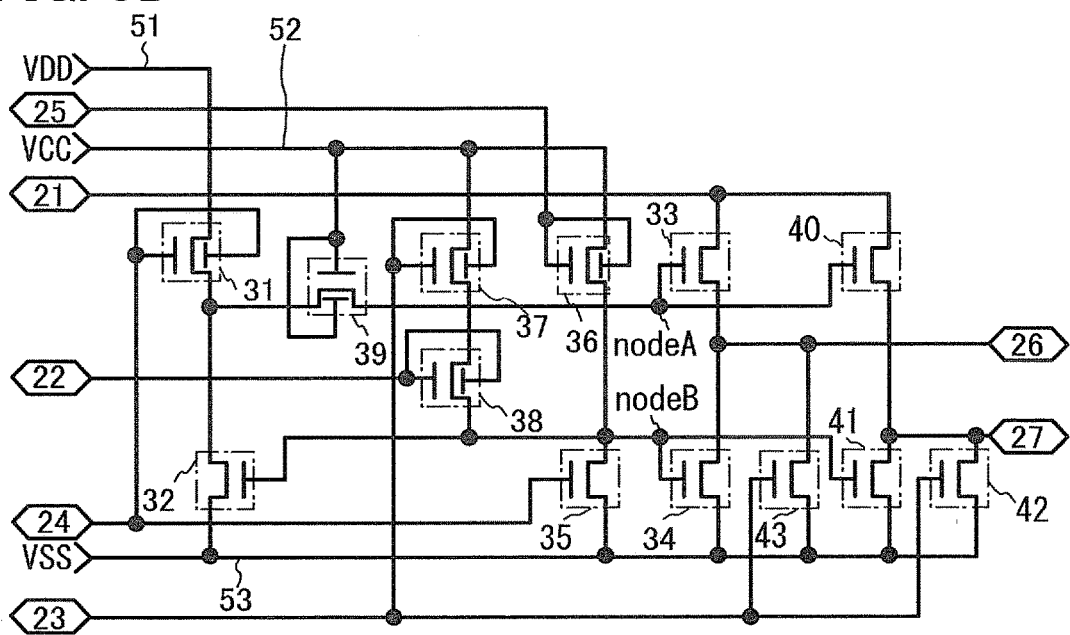

The first pulse output circuit 10_1 includes first to thirteenth transistors 31 to 43 (see FIG. 9D). A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 9D is as follows: the first power supply potential VDD is higher than or equal to the second power supply potential VCC, and the second power supply potential VCC is higher than the third power supply potential VSS. Note that the first to fourth clock signals (CK1) to (CK4) alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in the threshold voltage of the transistor can be reduced, and degradation of the transistor can be suppressed without an adverse effect on the operation of the transistor. Note that as illustrated in FIG. 9D, the thin film transistor 28 having four terminals that is illustrated in FIG. 9C is preferably used as the first transistor 31 and the sixth to ninth transistors 36 to 39 among the first to thirteenth transistors 31 to 43. The first transistor 31 and the sixth to ninth transistors 36 to 39 need to operate so that a potential of a node to which one electrode serving as a source or a drain is connected is switched with a control signal of the gate electrode, and can further reduce a malfunction of the pulse output circuit because response to the control signal input to the gate electrode is fast (the rise of on-state current is steep). Thus, with the use of the thin film transistor 28 having four terminals which is illustrated in FIG. 9C, the threshold voltage can be controlled, and a malfunction of the pulse output circuit can be further prevented. Note that although the first control signal G1 and the second control signal G2 are the same control signals in FIG. 9D, the first control signal G1 and the second control signal G2 may be different control signals.

In FIG. 9D, a first terminal of the first transistor 31 is electrically connected to the power supply line 51, a second terminal of the first transistor 31 is electrically connected to a first terminal of the ninth transistor 39, and gate electrodes (a first gate electrode and a second gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a first gate electrode and a second gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a first gate electrode and a second gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a first gate electrode and a second gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and gate electrodes (a first gate electrode and a second gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the first gate electrode and the second gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the first gate electrode and the second gate electrode) of the seventh transistor 37.

In FIG. 9D, a portion where the gate electrode of the third transistor 33, the gate electrode of the tenth transistor 40, and the second terminal of the ninth transistor 39 are connected is referred to as a node A. Moreover, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may change depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal, respectively.

Further, functions of a source and a drain might be switched when transistors having different polarities are employed or a direction of current flow is changed in circuit operation, for example. Therefore, the terms "source" and "drain" can be switched in this specification.

Figure 10A:
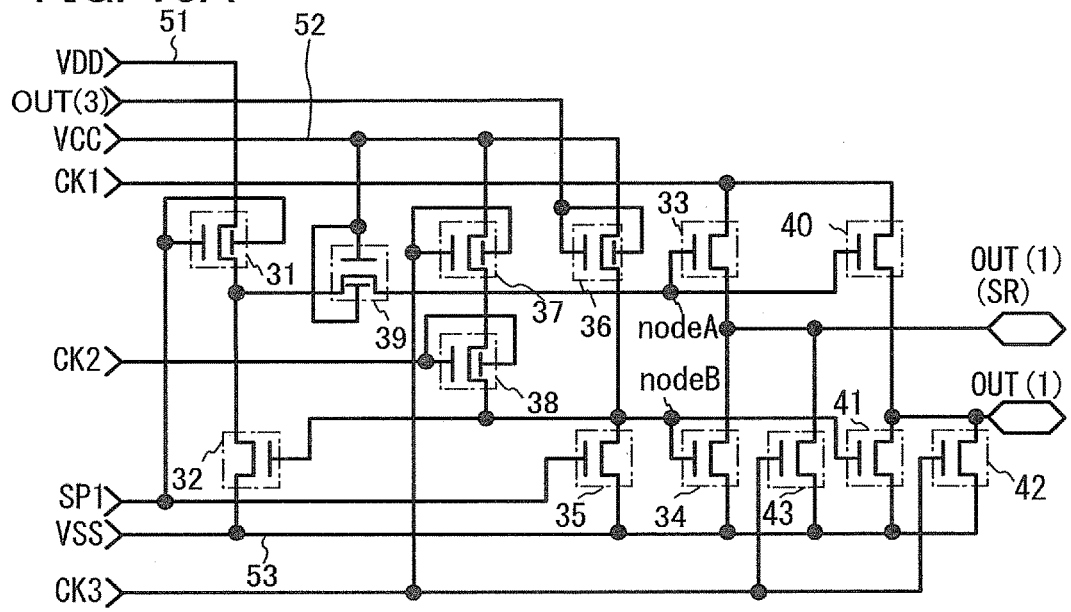
FIGS. 10A and 10B are a circuit diagram of a shift register and a timing chart, respectively.

Note that in FIG. 9D and FIG. 10A, a capacitor for performing bootstrap operation by bringing the node A into a floating state may be additionally provided. Furthermore, a capacitor having one electrode electrically connected to the node B may be additionally provided in order to hold a potential of the node B.

Figure 10B:
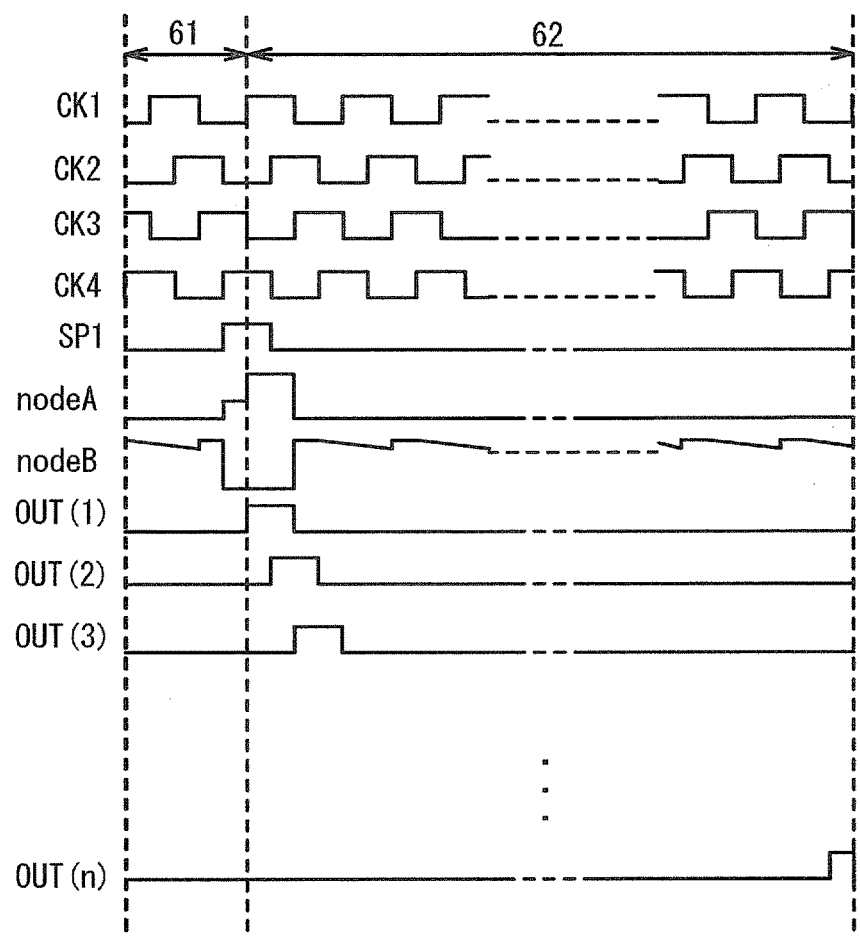

FIG. 10B is a timing chart of a shift register including a plurality of pulse output circuits illustrated in FIG. 10A. Note that when the shift register is included in a scan line driver circuit, a period 61 in FIG. 10B corresponds to a vertical retrace period and a period 62 corresponds to a gate selection period.

Note that the placement of the ninth transistor 39 in which the second power supply potential VCC is applied to the gate as illustrated in FIG. 10A has the following advantages before and after bootstrap operation.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the source of the first transistor 31 is switched to the first terminal, that is, the terminal on the power supply line 51 side. Consequently, in the first transistor 31, a high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in the potential of the second terminal of the first transistor 31 can be prevented while the potential of the node A is raised by bootstrap operation. In other words, the placement of the ninth transistor 39 makes it possible to lower the level of the negative bias voltage applied between the gate and the source of the first transistor 31. Thus, the circuit configuration in this embodiment allows a negative bias voltage applied between the gate and the source of the first transistor 31 to be reduced, whereby deterioration of the first transistor 31 due to stress can be prevented.

Note that the ninth transistor 39 can be provided anywhere as long as the first terminal and the second terminal of the ninth transistor 39 are connected between the second terminal of the first transistor 31 and the gate of the third transistor 33. Note that in the case where the shift register including a plurality of pulse output circuits in this embodiment is included in a signal line driver circuit having a larger number of stages than a scan line driver circuit, the ninth transistor 39 can be omitted, which results in a reduction in the number of transistors.

Note that an oxide semiconductor is used for a semiconductor layer in each of the first to thirteenth transistors 31 to 43, and thus the off-state current of the thin film transistors can be reduced, the on-state current and field effect mobility can be increased, and the degree of degradation of the transistors can be reduced. As a result, a malfunction in the circuit can be prevented. Moreover, the degree of deterioration of the transistor using an oxide semiconductor by application of a high potential to a gate electrode is smaller than that of a transistor using amorphous silicon. Consequently, similar operation can be obtained even when the first power supply potential VDD is supplied to the power supply line to which the second power supply potential VCC is supplied, and the number of power supply lines placed between circuits can be reduced; thus, the size of the circuit can be reduced.

Note that a similar function is obtained even when the connection relation is changed so that a clock signal that is supplied to the gate electrodes (the first gate electrode and the second gate electrode) of the seventh transistor 37 from the third input terminal 23 and a clock signal that is supplied to the gate electrodes (the first gate electrode and the second gate electrode) of the eighth transistor 38 from the second input terminal 22 are supplied from the second input terminal 22 and the third input terminal 23, respectively. In the shift register illustrated in FIG. 10A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in the potentials of the second input terminal 22 and the third input terminal 23 is caused twice by fall in the potential of the gate electrode of the seventh transistor 37 and fall in the potential of the gate electrode of the eighth transistor 38. On the other hand, in the shift register illustrated in FIG. 10A, when a state of the seventh transistor 37 and the eighth transistor 38 is changed as in the period in FIG. 10B so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B due to fall in potentials of the second input terminal 22 and the third input terminal 23 is reduced to one, which is caused by fall in potential of the gate electrode of the eighth transistor 38. Consequently, connection relation where the clock signal CK3 is supplied from the third input terminal 23 to the gate electrodes (the first gate electrode and the second gate electrode) of the seventh transistor 37 and the clock signal CK2 is supplied from the second input terminal 22 to the gate electrodes (the first gate electrode and the second gate electrode) of the eighth transistor 38 is preferably used, in which case the number of change in the potential of the node B can be reduced and noise can be reduced.

In such a manner, an H-level signal is regularly supplied to the node B in a period during which the potentials of the first output terminal 26 and the second output terminal 27 are held at L level; thus, a malfunction of the pulse output circuit can be prevented.

The thin film transistor in the driver circuit is manufactured by the manufacturing method of the thin film transistor which is described in Embodiment 1, whereby high speed operation of the thin film transistor in the driver circuit portion can be realized and power saving can be achieved.

This embodiment can be implemented in appropriate combination with any of the structures described in the other embodiments.

Embodiment 3

In this embodiment, a case will be described where thin film transistors are manufactured and a semiconductor device having a display function (also referred to as a display device) in which the thin film transistors are used in a pixel portion and driver circuits is manufactured. Further, some or all of the driver circuits including the thin film transistors can be formed over a substrate where the pixel portion is formed, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with a means for supplying current to the display element in each of a plurality of pixels. Specifically, the element substrate may be in a state in which only a pixel electrode of the display element, a state in which a conductive layer to be a pixel electrode is formed but is not etched yet to form the pixel electrode, or any other states.

Note that a display device in this specification refers to an image display device, a display device, or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP that is provided with a printed wiring board at the end thereof; and a module having an integrated circuit (IC) that is directly mounted on a display element by a chip on glass (COG) method.

In this embodiment, an example of a liquid crystal display device will be described as a semiconductor device which is one embodiment of the present invention. The appearance and a cross section of a liquid crystal display panel, which is one embodiment of a semiconductor device, are described with reference to FIGS. 11A1, 11A2, and 11B. FIGS. 11A1 and 11A2 are each a top view of a panel in which highly reliable thin film transistors 4010 and 4011 which include a semiconductor layer of an In—Ga—Zn—O-based non-single-crystal layer, and a liquid crystal element 4013, which are formed over a first substrate 4001, are sealed between the first substrate 4001 and a second substrate 4006 with a sealant 4005. FIG. 11B corresponds to a cross-sectional view of FIGS. 11A1 and 11A2 along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor or a polycrystalline semiconductor over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 11A1 illustrates an example in which the signal line driver circuit 4003 is mounted by a COG method. FIG. 11A2 illustrates an example in which the signal line driver circuit 4003 is mounted by a TAB method.

The pixel portion 4002 and the scan line driver circuit 4004 provided over the first substrate 4001 each include a plurality of thin film transistors. FIG. 11B illustrates, as an example, the thin film transistor 4010 included in the pixel portion 4002 and the thin film transistor 4011 included in the scan line driver circuit 4004. Insulating layers 4020 and 4021 are provided over the thin film transistors 4010 and 4011.

Any of the highly reliable thin film transistors including the oxide semiconductor layers which are described in Embodiment 1 can be used as the thin film transistors 4010 and 4011. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in the threshold voltage of the thin film transistor 4011 before and after the BT test can be reduced. The potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by reference numeral 4035 is obtained by selective etching of an insulating film and is provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between the pair of substrates using the common connection portion. Note that the conductive particles are included in the sealant 4005.

In addition, liquid crystals exhibiting a blue phase for which an alignment film is unnecessary may be used. The blue phase is one of liquid crystal phases, which appears just before a cholesteric phase changes into an isotropic phase while the temperature of a cholesteric liquid crystal is increased. Since the blue phase only appears within a narrow range of temperature, the liquid crystal layer 4008 is formed using a liquid crystal composition in which a chiral agent is mixed at 5 wt % or more in order to increase the temperature range. The liquid crystal composition including liquid crystals exhibiting a blue phase and a chiral agent has a short response time of 1 msec or less and is optically isotropic; thus, alignment treatment is not needed and viewing angle dependence is small.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. The layered structure of the polarizing plate and the coloring layer is not limited to that in this embodiment and may be set as appropriate depending on materials of the polarizing plate and the coloring layer or the conditions of the manufacturing process. A light-blocking layer which functions as a black matrix may be provided when needed.

In this embodiment, in order to reduce surface unevenness of the thin film transistors and to improve reliability of the thin film transistors, the thin film transistors are covered with a protective layer or the insulating layers (the insulating layer 4020 and the insulating layer 4021) which function as planarization insulating layers. Note that the protective layer is provided to prevent entry of a contaminant impurity such as an organic substance, a metal substance, or moisture floating in the air and is preferably a dense film. The protective layer may be formed with a single layer or a stacked layer of a silicon oxide layer, a silicon nitride layer, a silicon oxynitride layer, a silicon nitride oxide layer, an aluminum oxide layer, an aluminum nitride layer, aluminum oxynitride layer, and/or an aluminum nitride oxide layer by a sputtering method. In this embodiment, an example in which the protective layer is formed by a sputtering method is described; however, there is no particular limitation on a method, and various kinds of methods may be used.

Here, the insulating layer 4020 having a stacked-layer structure is formed as the protective layer. Here, as a first layer of the insulating layer 4020, a silicon oxide layer is formed by a sputtering method. The use of a silicon oxide layer for the protective layer provides an advantageous effect of preventing hillock of an aluminum layer used for a source electrode layer and a drain electrode layer.

An insulating layer is formed as a second layer of the protective layer. Here, as a second layer of the insulating layer 4020, a silicon nitride layer is formed by a sputtering method. The use of the silicon nitride layer as the protective layer can prevent mobile ions such as sodium ions from entering a semiconductor region, thereby suppressing variations in electric characteristics of the TFT.

After the protective layer is formed, annealing (300° C. to 400° C.) of the semiconductor layer may be performed.

The insulating layer 4021 is formed as the planarization insulating layer. As the insulating layer 4021, an organic material having heat resistance, such as polyimide, an acrylic resin, a benzocyclobutene-based resin, polyamide, or an epoxy resin, can be used. Besides the above organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method of forming the insulating layer 4021. The insulating layer 4021 can be formed, depending on the material, by a method such as sputtering, an SOG method, a spin coating method, a dipping method, a spray coating method, a droplet discharge method (e.g., an inkjet method, screen printing, or offset printing), or a tool such as a doctor knife, a roll coater, a curtain coater, or a knife coater. In the case where the insulating layer 4021 is formed using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. As examples thereof, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the thin film transistors 4010 and 4011.

The connection terminal electrode 4015 is electrically connected to a terminal included in the FPC 4018 through an anisotropic conductive layer 4019.

FIGS. 11A1, 11A2, and 11B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 12:
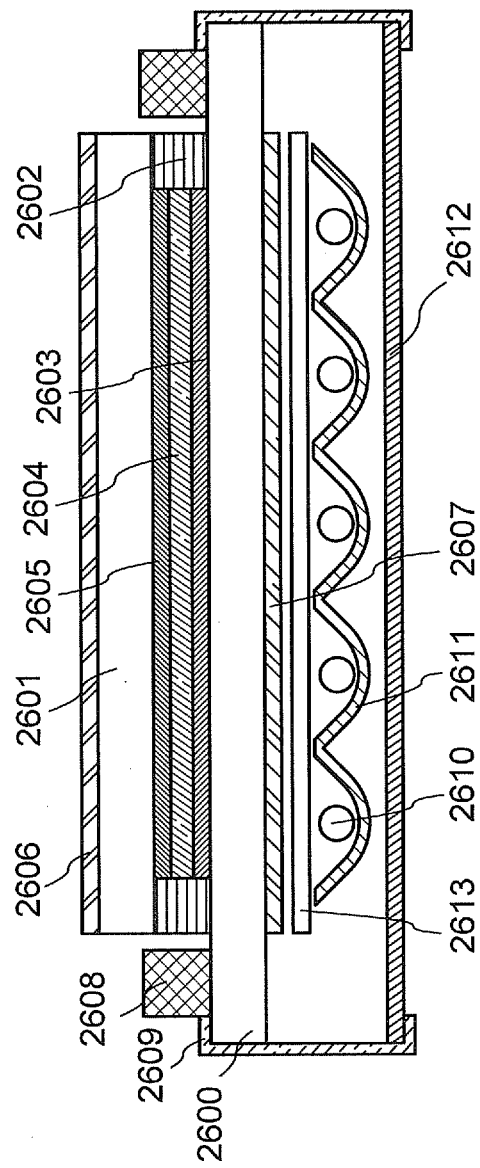
FIG. 12 illustrates a semiconductor device.

FIG. 12 illustrates an example in which a liquid crystal display module which corresponds to one embodiment of a semiconductor device is formed using a TFT substrate 2600. FIG. 12 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflection plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above-described steps, a highly reliable liquid crystal display device can be manufactured as a semiconductor device.

Thin film transistors in the pixel portion of the liquid crystal display device are manufactured using the thin film transistor described in Embodiment 1, whereby display unevenness caused by variation in threshold voltage of the thin film transistors in pixels can be suppressed.

Further, the thin film transistors in the driver circuit portion of the liquid crystal display device are manufactured by the manufacturing method of the thin film transistor which is described in Embodiment 1, whereby high-speed operation of the thin film transistors in the driver circuit portion can be realized and power saving can be achieved.

This embodiment can be implemented in appropriate combination with any of the structures described in the other embodiments.

Embodiment 4

In this embodiment, an example of electronic paper will be described as one embodiment of a semiconductor device.

The thin film transistor described in Embodiment 1 can be used for electronic paper in which electronic ink is driven by an element electrically connected to a switching element. The electronic paper is also referred to as an electrophoretic display device (an electrophoretic display) and has advantages such as the same level of readability as regular paper, lower power consumption than other display devices, thinness, and lightness in weight.

Electrophoretic displays can have various modes. Electrophoretic displays contain a plurality of microcapsules dispersed in a solvent or a solute, each of which contains first particles that are positively charged and second particles that are negatively charged. By application of an electric field to the microcapsules, the particles in the microcapsules move in opposite directions to each other and only the color of the particles gathering on one side is displayed. Note that the first particles and the second particles each include a pigment and do not move without an electric field. Moreover, the first particles and the second particles have different colors (which may be colorless).

Thus, an electrophoretic display utilizes a so-called dielectrophoretic effect by which a substance having a high dielectric constant moves to a high-electric field region.

A solution in which the above-described microcapsules are dispersed in a solvent is referred to as electronic ink. This electronic ink can be printed on a surface of glass, plastic, cloth, paper, or the like. Furthermore, color display is possible with a color filter or particles including a pigment.

When a plurality of the above-described microcapsules are arranged as appropriate over an active matrix substrate so as to be sandwiched between two electrodes, an active matrix display device can be completed, and display can be performed by application of an electric field to the microcapsules. For example, the active matrix substrate formed using the thin film transistor in Embodiment 1 can be used.

Note that the first particles and the second particles in the microcapsules may be formed using one of a conductive material, an insulating material, a semiconductor material, a magnetic material, a liquid crystal material, a ferroelectric material, an electroluminescent material, an electrochromic material, and a magnetophoretic material or a composite material of any of these materials.

Figure 13:
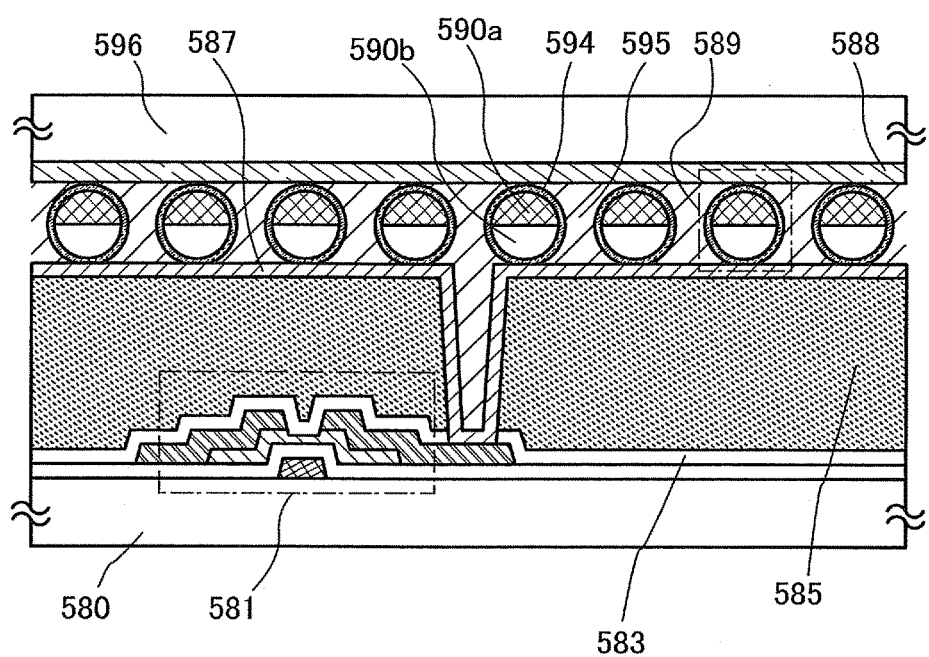
FIG. 13 illustrates a semiconductor device.

FIG. 13 illustrates active matrix electronic paper as an example of a semiconductor device. A thin film transistor 581 used for the semiconductor device can be formed in a manner similar to the thin film transistor described in Embodiment 1 and is a highly reliable thin film transistor including an oxide semiconductor layer.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and an potential difference is generated between the first electrode layer and the second electrode layer to control the orientation of the spherical particles, whereby display is performed.

The thin film transistor 581 formed over a substrate 580 is a bottom-gate thin film transistor and covered with an insulating layer 583 that is in contact with a semiconductor layer. A source electrode layer or a drain electrode layer of the thin film transistor 581 is in contact with a first electrode layer 587 through an opening formed in the insulating layer 583 and an insulating layer 585, whereby the thin film transistor 581 is electrically connected to the first electrode layer 587. Spherical particles 589 are provided between the first electrode layer 587 and a second electrode layer 588 formed on a substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin (see FIG. 13). The first electrode layer 587 corresponds to a pixel electrode, and the second electrode layer 588 corresponds to a common electrode. The second electrode layer 588 is electrically connected to a common potential line provided over the substrate where the thin film transistor 581 is formed. With the use of a common connection portion, the second electrode layer 588 and the common potential line can be electrically connected to each other through conductive particles provided between the pair of substrates.

Alternatively, it is possible to use an electrophoretic element instead of the twisting ball. A microcapsule having a diameter of approximately 10 μm to 200 μm, in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions, whereby white or black can be displayed. A display element using this principle is an electrophoretic display element. The electrophoretic display element has higher reflectance than a liquid crystal display element; thus, an auxiliary light is not needed, power consumption is low, and a display portion can be recognized in a dim place. In addition, even when power is not supplied to the display portion, an image which has been displayed can be maintained. Thus, a displayed image can be stored.

Through the above-described steps, a highly reliable electronic paper can be manufactured as a semiconductor device.

This embodiment can be implemented in appropriate combination with any of the structures described in the other embodiments.

Embodiment 5

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element and the latter is referred to as an inorganic EL element.

In an organic EL element, by application of voltage to the light-emitting element, electrons and holes are separately injected from a pair of electrodes into a layer containing a light-emitting organic compound, and thus current flows. The carriers (electrons and holes) are recombined, and thus the light-emitting organic compound is excited. When the light-emitting organic compound returns to a ground state from the excited state, light is emitted. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that here, an organic EL element is described as a light-emitting element.

Figure 14:
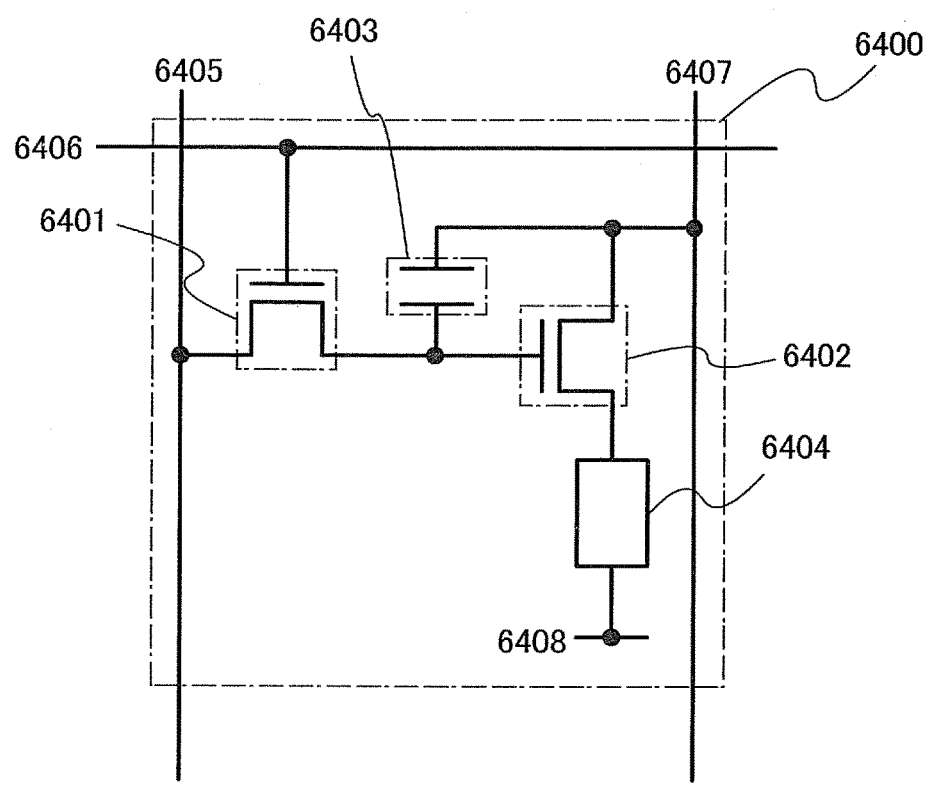
FIG. 14 illustrates a pixel equivalent circuit.

FIG. 14 illustrates an example of a pixel structure to which digital time grayscale driving can be applied, as an example of a semiconductor device.

A structure and operation of a pixel to which the digital time grayscale driving can be applied are described. Here, one pixel includes two n-channel transistors in each of which an oxide semiconductor layer is used for a channel formation region.

A pixel 6400 includes a switching transistor 6401, a transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is lower than a high power supply potential that is set to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. In order to make the light-emitting element 6404 emit light, each potential is set so that the potential difference between the high power supply potential and the low power supply potential is higher than or equal to the forward threshold voltage of the light-emitting element 6404.

Note that gate capacitance of the driving transistor 6402 may be used as a substitute for the capacitor 6403, in which case the capacitor 6403 can be omitted. The gate capacitance of the driving transistor 6402 may be formed between the channel region and the gate electrode.

In the case of employing a voltage-input voltage-driving method, a video signal is input to the gate of the driving transistor 6402 so that the driving transistor 6402 is in either of two states of being sufficiently turned on or turned off. In other words, the driving transistor 6402 operates in a linear region. Since the driving transistor 6402 operates in the linear region, a voltage higher than the voltage of the power supply line 6407 is applied to the gate of the driving transistor 6402. Note that a voltage higher than or equal to the sum of the power supply line voltage and $V_{th}$ of the driving transistor 6402 is applied to the signal line 6405.

In the case of employing an analog grayscale method instead of the digital time grayscale method, the same pixel structure as in FIG. 14 can be employed by changing signal input.

In the case of performing analog grayscale driving, a voltage higher than or equal to the sum of the forward voltage of the light-emitting element 6404 and $V_{th}$ of the driving transistor 6402 is applied to the gate of the driving transistor 6402. The forward voltage of the light-emitting element 6404 refers to a voltage at which a desired luminance is obtained, and refers to at least a forward threshold voltage. The video signal by which the driving transistor 6402 operates in a saturation region is input, so that current can be supplied to the light-emitting element 6404. In order to operate the driving transistor 6402 in the saturation region, the potential of the power supply line 6407 is set higher than the gate potential of the driving transistor 6402. When an analog video signal is used, a current corresponding to the video signal is supplied to the light-emitting element 6404, whereby the analog grayscale driving can be performed.

Note that the pixel structure is not limited to that illustrated in FIG. 14. For example, a switch, a resistor, a capacitor, a transistor, a logic circuit, or the like may be added to the pixel illustrated in FIG. 14.

Next, a structure of a light-emitting element will be described with reference to FIGS. 15A to 15C. Here, a cross-sectional structure of a pixel will be described using an n-channel driving TFT as an example. TFTs 7001, 7011, and 7021 which are driving TFTs used in semiconductor devices illustrated in FIGS. 15A, 15B, and 15C can be formed in a manner similar to that of the thin film transistor described in Embodiment 1 and are highly reliable thin film transistors each including an oxide semiconductor layer.

In order to extract light emitted from the light-emitting element, at least one of an anode and a cathode needs to be transparent. A thin film transistor and a light-emitting element are formed over a substrate. The light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having the bottom emission structure will be described with reference to FIG. 15A.

Figure 15A:
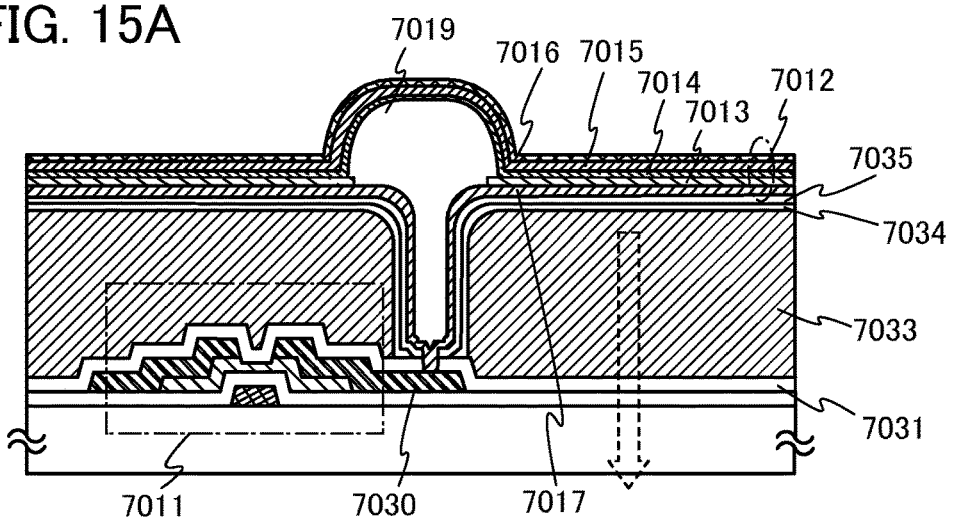
FIGS. 15A to 15C each illustrate a semiconductor device.

FIG. 15A is a cross-sectional view of a pixel in the case where the driving TFT 7011 is an n-channel TFT and light is emitted from a light-emitting element 7012 to the cathode 7013 side. In FIG. 15A, the cathode 7013 of the light-emitting element 7012 is formed over a light-transmitting conductive layer 7017 that is electrically connected to the driving TFT 7011, and an EL layer 7014 and an anode 7015 are stacked in this order over the cathode 7013. Note that the light-transmitting conductive layer 7017 is electrically connected to a drain electrode layer 7030 of the TFT 7011 through a contact hole formed in an oxide insulating layer 7031.

As the light-transmitting conductive layer 7017, a light-transmitting conductive layer formed using indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used.

Any of a variety of materials can be used for the cathode 7013. Specifically, the cathode 7013 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 15A, the thickness of the cathode 7013 is a thickness that allows light transmission (the thickness is preferably about 5 nm to 30 nm). For example, an aluminum layer with a thickness of 20 nm is used for the cathode 7013.

Note that a light-transmitting conductive layer and an aluminum layer may be stacked and then selectively etched so that the light-transmitting conductive layer 7017 and the cathode 7013 are formed. In that case, the etching can be performed using one mask, which is preferable.

The peripheral portion of the cathode 7013 is covered with a partition 7019. The partition 7019 is formed using an organic resin layer of polyimide, an acrylic resin, polyamide, an epoxy resin, or the like; an inorganic insulating layer; or organic polysiloxane. It is particularly preferable that the partition 7019 be formed using a photosensitive resin material to have an opening over the cathode 7013 so that a sidewall of the opening is formed as an inclined surface with continuous curvature. In the case where a photosensitive resin material is used for the partition 7019, a step of forming a resist mask can be omitted.

The EL layer 7014 which is formed over the cathode 7013 and the partition 7019 may be formed using a single layer or a plurality of layers stacked. When the EL layer 7014 is formed using a plurality of layers, the EL layer 7014 is formed by stacking an electron-injection layer, an electron-transport layer, a light-emitting layer, a hole-transport layer, and a hole-injection layer in that order over the cathode 7013. Note that not all of these layers need to be provided.

The stacking order is not limited to the above order. A hole-injection layer, a hole-transport layer, a light-emitting layer, an electron-transport layer, and an electron-injection layer may be stacked in that order over the cathode 7013. However, when power consumption is compared, an electron-injection layer, an electron-transport layer, a light-emitting layer, a hole-transport layer, and a hole-injection layer are preferably stacked in that order over the cathode 7013 because of lower power consumption.

A variety of materials can be used for the anode 7015 which is formed over the EL layer 7014. Specifically, a material having a high work function, such as titanium nitride, ZrN, Ti, W, Ni, Pt, or Cr; or a transparent conductive material such as ITO, IZO (indium zinc oxide), or ZnO, is preferable. In addition, a light-blocking film 7016, for example, a metal which blocks light, a metal which reflects light, or the like is provided over the anode 7015. In this embodiment, an ITO film is used for the anode 7015, and a Ti layer is used for the light-blocking film 7016.

The light-emitting element 7012 corresponds to a region where the EL layer 7014 is sandwiched between the cathode 7013 and the anode 7015. In the case of the element structure illustrated in FIG. 15A, light is emitted from the light-emitting element 7012 to the cathode 7013 side as indicated by an arrow.

In FIG. 15A, an example in which a light-transmitting conductive layer is used as a gate electrode layer is illustrated. Light emitted from the light-emitting element 7012 passes through a color filter layer 7033 and then passes through the gate electrode layer, a source electrode layer, a drain electrode layer, and the like of the TFT 7011 so as to be emitted to the outside. A light-transmitting conductive layer is used as the gate electrode layer, the source electrode layer, the drain electrode layer, and the like of the TFT 7011, whereby aperture ratio can be improved.

The color filter layer 7033 is formed by a droplet discharge method such as an inkjet method, a printing method, an etching method with the use of a photolithography technique, or the like.

The color filter layer 7033 is covered with an overcoat layer 7034, and also covered with a protective insulating layer 7035. Note that, although the overcoat layer 7034 with a thin thickness is illustrated in FIG. 15A, the overcoat layer 7034 has a function of planarizing a surface with unevenness caused by the color filter layer 7033.

Further, a contact hole which is formed in the protective insulating layer 7035, the overcoat layer 7034, the color filter layer 7033, and the oxide insulating layer 7031 and reaches the drain electrode layer 7030 is positioned in a region overlapping with the partition 7019. The contact hole which reaches the drain electrode layer 7030 and the partition 7019 overlap with each other, whereby aperture ratio can be improved.

Next, a light-emitting element having a dual emission structure will be described with reference to FIG. 15B.

Figure 15B:
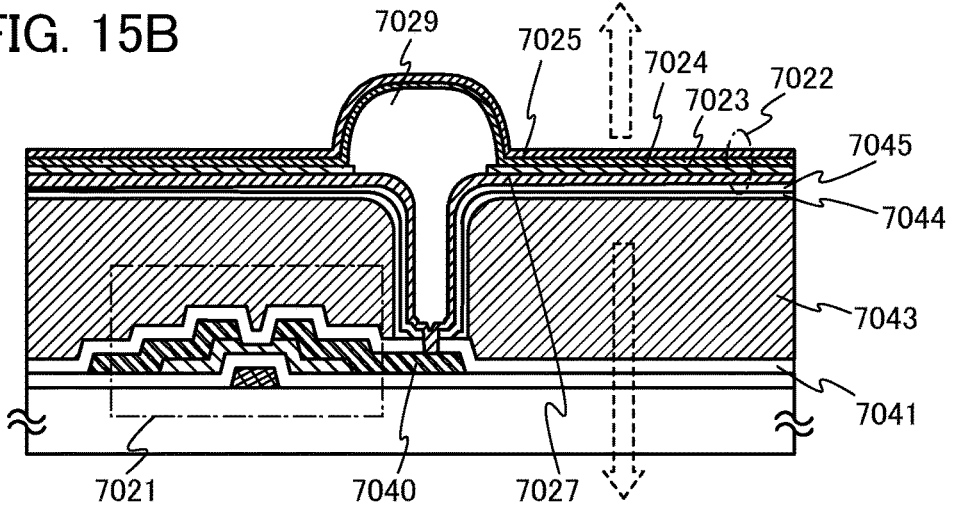

In FIG. 15B, a cathode 7023 of a light-emitting element 7022 is formed over a light-transmitting conductive layer 7027 which is electrically connected to a TFT 7021, and an EL layer 7024 and an anode 7025 are stacked in that order over the cathode 7023. Note that the light-transmitting conductive layer 7027 is electrically connected to a drain electrode layer 7040 of the TFT 7021 through a contact hole formed in an oxide insulating layer 7041.

As the light-transmitting conductive layer 7027, a light-transmitting conductive layer formed of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used.

Any of a variety of materials can be used for the cathode 7023. Specifically, the cathode 7023 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the thickness of the cathode 7023 is a thickness that allows light transmission (the thickness is preferably about 5 nm to 30 nm). For example, an aluminum layer with a thickness of 20 nm is used for the cathode 7023.

Note that a light-transmitting conductive layer and an aluminum layer may be stacked and then selectively etched so that the light-transmitting conductive layer 7027 and the cathode 7023 are formed. In that case, the etching can be performed using one mask, which is preferable.

The peripheral portion of the cathode 7023 is covered with a partition 7029. The partition 7029 is formed using an organic resin layer of polyimide, an acrylic resin, polyamide, an epoxy resin, or the like; an inorganic insulating layer; or organic polysiloxane. It is particularly preferable that the partition 7029 be formed using a photosensitive resin material to have an opening over the cathode 7023 so that a sidewall of the opening is formed as an inclined surface with continuous curvature. In the case where a photosensitive resin material is used for the partition 7029, a step of forming a resist mask can be omitted.

The EL layer 7024 which is formed over the cathode 7023 and the partition 7029 may be formed using a single layer or a plurality of layers stacked. When the EL layer 7024 is formed using a plurality of layers, the EL layer 7024 is formed by stacking an electron-injection layer, an electron-transport layer, a light-emitting layer, a hole-transport layer, and a hole-injection layer in that order over the cathode 7023. Note that not all of these layers need to be provided.

The stacking order is not limited to the above; that is, a hole-injection layer, a hole-transport layer, a light-emitting layer, an electron-transport layer, and an electron-injection layer may be stacked in that order over the cathode 7023. However, when power consumption is compared, an electron-injection layer, an electron-transport layer, a light-emitting layer, a hole-transport layer, and a hole-injection layer are preferably stacked in that order over the cathode 7023 because of lower power consumption.

A variety of materials can be used for the anode 7025 which is formed over the EL layer 7024. Specifically, a material having a high work function, such as a transparent conductive material such as ITO, IZO, or ZnO, is preferable. In this embodiment, an ITO film containing silicon oxide is used for an anode 7026.

The light-emitting element 7022 corresponds to a region where the EL layer 7024 is sandwiched between the cathode 7023 and the anode 7025. In the case of the element structure illustrated in FIG. 15B, light is emitted from the light-emitting element 7022 to both the anode 7025 side and the cathode 7023 side as indicated by arrows.

In FIG. 15B, an example in which a light-transmitting conductive layer is used as a gate electrode layer is illustrated. Light emitted from the light-emitting element 7022 to the cathode 7023 side passes through a color filter layer 7043 and then passes through the gate electrode layer, a source electrode layer, a drain electrode layer, and the like of the TFT 7011 so as to be emitted to the outside. A light-transmitting conductive layer is used as the gate electrode layer, the source electrode layer, the drain electrode layer, and the like of the TFT 7021, whereby aperture ratio on the anode 7025 side can be substantially the same as that on the cathode 7023 side.

The color filter layer 7043 is formed by a droplet discharge method such as an inkjet method, a printing method, an etching method with the use of a photolithography technique, or the like.

The color filter layer 7043 is covered with an overcoat layer 7044, and also covered with a protective insulating layer 7045.

Note that when a light-emitting element having a dual emission structure is used and full color display is performed on both display surfaces, light from the anode 7025 side does not pass through the color filter layer 7043; thus, a sealing substrate provided with another color filter layer is preferably provided on the anode 7025.

Further, a contact hole which is formed in the protective insulating layer 7045, the overcoat layer 7044, the color filter layer 7043, and the oxide insulating layer 7041 and reaches the drain electrode layer 7040 is positioned in a region overlapping with the partition 7029. The contact hole which reaches the drain electrode layer 70430 and the partition 7029 overlap with each other, whereby aperture ratio on the anode 7025 side can be substantially the same as that on the cathode 7023 side.

Next, a light-emitting element having a top emission structure will be described with reference to FIG. 15C.

Figure 15C:
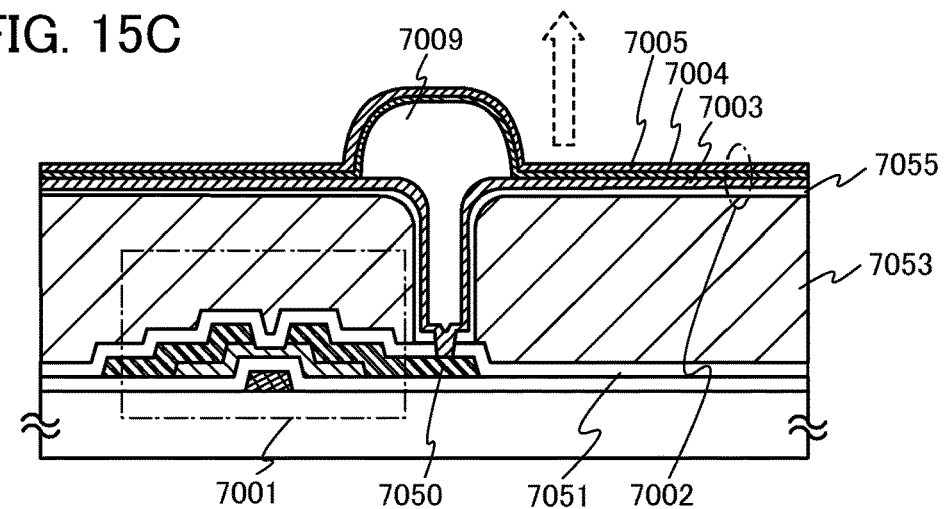

FIG. 15C is a cross-sectional view of a pixel in the case where a driving TFT 7001 is an n-channel thin film transistor and light is emitted from a light-emitting element 7002 to the anode 7005 side. In FIG. 15C, a cathode 7003 of the light-emitting element 7002 which is electrically connected to the TFT 7001 is formed, and an EL layer 7004 and the anode 7005 are stacked in that order over the cathode 7003. A variety of materials can be used for the cathode 7003. Specifically, a material having a low work function, such as an alkali metal such as Li or Cs, an alkaline earth metal such as Mg, Ca, or Sr, an alloy containing any of these metals (e.g., Mg:Ag or Al:Li), and a rare earth metal such as Yb or Er, is preferable.

The peripheral portion of the cathode 7003 is covered with a partition 7009. The partition 7009 is formed using an organic resin layer of polyimide, an acrylic resin, polyamide, an epoxy resin, or the like; an inorganic insulating layer; or organic polysiloxane. It is particularly preferable that the partition 7009 be formed using a photosensitive resin material to have an opening over the cathode 7003 so that a sidewall of the opening is formed as an inclined surface with continuous curvature. In the case where a photosensitive resin material is used for the partition 7009, a step of forming a resist mask can be omitted.

The EL layer 7004 which is formed over the cathode 7003 and the partition 7009 may be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the cathode 7003. Note that not all of these layers need to be provided.

The stacking order is not limited to the above; that is, a hole-injection layer, a hole-transport layer, a light-emitting layer, an electron-transport layer, and an electron-injection layer may be stacked in that order over the cathode 7003. In the case where these layers are stacked in that order, the cathode 7003 functions as an anode.

In FIG. 15C, a hole-injection layer, a hole-transport layer, a light-emitting layer, an electron-transport layer, and an electron injection layer are stacked in this order over a stacked layer in which a Ti layer, an aluminum, a Ti layer are stacked in this order, and thereover, a stacked layer of a Mg:Ag alloy thin film and an ITO film is formed.

However, when power consumption is compared, an electron-injection layer, an electron-transport layer, a light-emitting layer, a hole-transport layer, and a hole-injection layer are preferably stacked in that order over the cathode 7003 because of lower power consumption.

The anode 7005 is formed using a light-transmitting conductive material. The anode 7005 may be formed using a light-transmitting conductive layer formed using, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

The light-emitting element 7002 corresponds to a region where the EL layer 7004 is sandwiched between the cathode 7003 and the anode 7005. In the case of the element structure illustrated in FIG. 15C, light is emitted from the light-emitting element 7002 to the anode 7005 side as indicated by an arrow.

In FIG. 15C, the example in which the thin film transistor 150 is used as the TFT 7001 is illustrated; however, there is no particular limitation thereto, and the thin film transistor 160, the thin film transistor 170, or the thin film transistor 180 can be used.

In FIG. 15C, the cathode 7003 is electrically connected to a drain electrode layer 7050 of the TFT 7001 through a contact hole formed in an oxide insulating layer 7051, a planarization insulating layer 7053, and an insulating layer 7055. The planarization insulating layer 7053 can be formed using a resin material such as polyimide, an acrylic resin, a benzocyclobutene-based resin, polyamide, or an epoxy resin. Besides the above-described resin materials, it is also possible to use a low-dielectric constant material (low-k material), a siloxane-based resin, phosphosilicate glass (PSG), borophosphosilicate glass (BPSG), or the like. Note that the planarization insulating layer 7053 may be formed by stacking a plurality of insulating layers formed of these materials. There is no particular limitation on the method for forming the planarization insulating layer 7053. The planarization insulating layer 7053 can be formed, depending on the material, by a method such as a sputtering method, an SOG method, spin coating, dip coating, spray coating, or a droplet discharge method (such as an inkjet method, screen printing, offset printing, or the like), or a tool such as a doctor knife, a roll coater, a curtain coater, or a knife coater.

The partition 7009 is provided so as to insulate the cathode 7003 from a cathode 7008 of an adjacent pixel. The partition 7009 is formed using an organic resin layer formed of polyimide, an acrylic resin, polyamide, an epoxy resin, or the like; an inorganic insulating layer; or organic polysiloxane. It is particularly preferable that the partition 7009 be formed using a photosensitive resin material to have an opening over the cathode 7003 so that a sidewall of the opening is formed as an inclined surface with continuous curvature. In the case where a photosensitive resin material is used for the partition 7009, a step of forming a resist mask can be omitted.

In the structure of FIG. 15C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

In the structure of FIG. 15C, a light-emitting display device capable of full color display may be manufactured in such a manner that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that although the organic EL elements are described here as the light-emitting elements, an inorganic EL element can be provided as the light-emitting element.

Note that the example is described in which the thin film transistor (the driving TFT) which controls the driving of a light-emitting element is electrically connected to the light-emitting element; alternatively, a structure may be employed in which a TFT for current control is connected between the driving TFT and the light-emitting element.

Next, the appearance and a cross section of a light-emitting display panel (also referred to as a light-emitting panel) which is one embodiment of a semiconductor device will be described with reference to FIGS. 16A and 16B. FIG. 16A is a plan view of a panel in which a thin film transistor and a light-emitting element that are formed over a first substrate are sealed between the first substrate and a second substrate with a sealant. FIG. 16B is a cross-sectional view taken along line H-I in FIG. 16A.

A sealant 4505 is provided so as to surround a pixel portion 4502, signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Consequently, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. In this manner, a panel is preferably packaged (sealed) with a protection film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 16B.

The highly reliable thin film transistor including the oxide semiconductor layer described in Embodiment 1 can be used as the thin film transistors 4509 and 4510. In this embodiment, the thin film transistors 4509 and 4510 are n-channel thin film transistors.

A conductive layer 4540 is provided over part of an insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in the threshold voltage of the thin film transistor 4509 before and after the BT test can be reduced. The potential of the conductive layer 4540 may be the same or different from that of a gate electrode layer in the thin film transistor 4509. The conductive layer 4540 can also function as a second gate electrode layer. Alternatively, the potential of the conductive layer 4540 may be GND or 0 V, or the conductive layer 4540 may be in a floating state.

In the thin film transistor 4509, as a protective insulating layer, an insulating layer 4541 is formed in contact with a semiconductor layer including a channel formation region. The insulating layer 4541 may be formed using a material and a method which are similar to those of the insulating layer 107 described in Embodiment 1. Moreover, the insulating layer 4544 functioning as a planarization insulating layer covers the thin film transistors in order to reduce surface unevenness of the thin film transistors. Here, as the insulating layer 4541, a silicon oxide layer is formed by a sputtering method in a manner similar to that of the insulating layer 107 described in Embodiment 1.

Further, a protective insulating layer 4543 is formed over the insulating layer 4541. The protective insulating layer 4543 may be formed using a material and a method similar to those of the protective insulating layer 407 described in Embodiment 1. Here, as the protective insulating layer 4543, a silicon nitride film is formed by a PCVD method.

Further, the insulating layer 4544 is formed as the planarization insulating layer. The insulating layer 4544 may be formed using a material and a method which are similar to those of the insulating layer 4021 described in Embodiment 3. Here, the insulating layer 4544 is formed using an acrylic resin.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to a layered structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed as a single layer or a plurality of layers stacked.

A protection layer may be formed over the second electrode layer 4513 and the partition 4520 in order to prevent entry of oxygen, hydrogen, moisture, carbon dioxide, or the like into the light-emitting element 4511. As the protection layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive layer as the first electrode layer 4517 included in the light-emitting element 4511, and a terminal electrode 4516 is formed using the same conductive layer as the source and drain electrode layers included in the thin film transistors 4509 and 4510.

The connection terminal electrode 4515 is electrically connected to a terminal included in the FPC 4518a through an anisotropic conductive layer 4519.

The substrate positioned in the direction in which light is extracted from the light-emitting element 4511 needs to have light-transmitting properties. In that case, a light-transmitting material such as a glass plate, a plastic plate, a polyester film, or an acrylic resin film is used for the second substrate.

As the filler 4507, an ultraviolet curable resin or a thermosetting resin can be used in addition to an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used for the filler If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment can be performed by which reflected light can be diffused by projections and depressions on the surface so as to reduce glare.

Driver circuits formed using a single crystal semiconductor or a polycrystalline semiconductor over a substrate separately prepared may be mounted as the signal line driver circuits 4503a and 4503b and the scan line driver circuits 4504a and 4504b. Alternatively, only the signal line driver circuits or part thereof, or only the scan line driver circuits or part thereof may be separately formed and mounted. This embodiment is not limited to the structure illustrated in FIGS. 16A and 16B.

Through the above-described steps, a highly reliable light-emitting display device (display panel) can be manufactured as a semiconductor device.

The thin film transistors in the pixel portion of the light-emitting display device are manufactured by the manufacturing method of the thin film transistor which is described in Embodiment 1, whereby display unevenness caused by variation in threshold voltage of the thin film transistors in pixels can be suppressed.

In addition, the thin film transistors in the driver circuits of the light-emitting display device are manufactured by the manufacturing method of the thin film transistor which is described in Embodiment 1, whereby high-speed operation of the thin film transistors in the driver circuit portion can be realized and power saving can be achieved.

This embodiment can be implemented in appropriate combination with any of the structures described in the other embodiments.

Embodiment 6

In this embodiment, as one embodiment of a semiconductor device, an example of a liquid crystal display device including a liquid crystal element and the thin film transistor described in Embodiment 1 will be described with reference to FIGS. 17, 18, 19, and 20. The thin film transistor described in Embodiment 1 can be used as TFTs 628 and 629 used in a liquid crystal display device illustrated in FIGS. 17, 18, 19, and 20. The TFTs 628 and 629 are transistors with excellent electric characteristics and high reliability which can be manufactured through a process similar to that described in Embodiment 1. The TFTs 628 and 629 each include a channel formation region formed in an oxide semiconductor layer. With reference to FIGS. 17, 18, 19, and 20, a case where the thin film transistor illustrated in FIG. 3C is used as an example of a thin film transistor will be described; however, this embodiment is not limited thereto.

A vertical alignment (VA) liquid crystal display device will be described below. VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Liquid crystal display devices of the multi-domain design will be described below.

Figure 17:
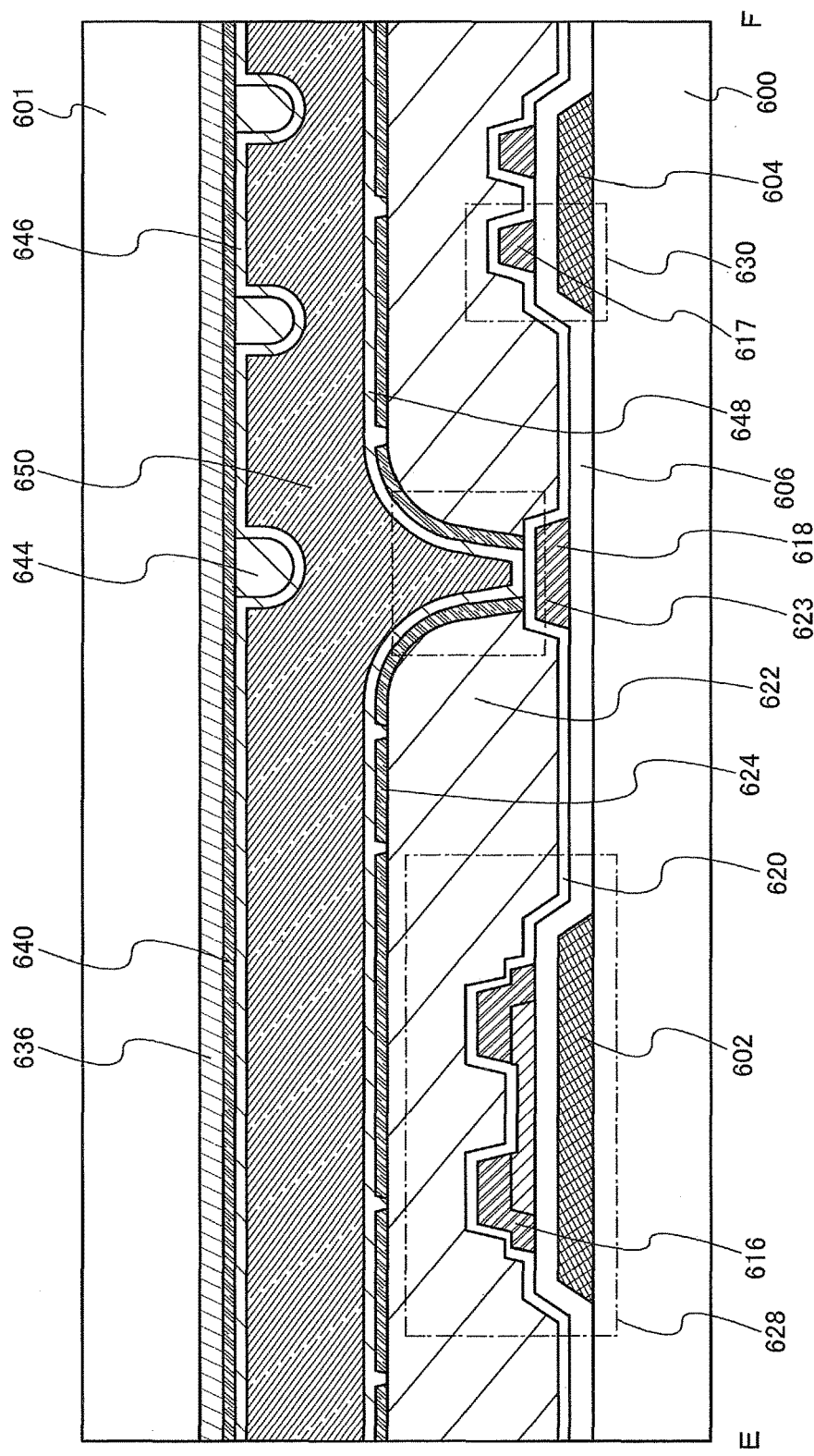
FIG. 17 illustrates a semiconductor device.
Figure 18:
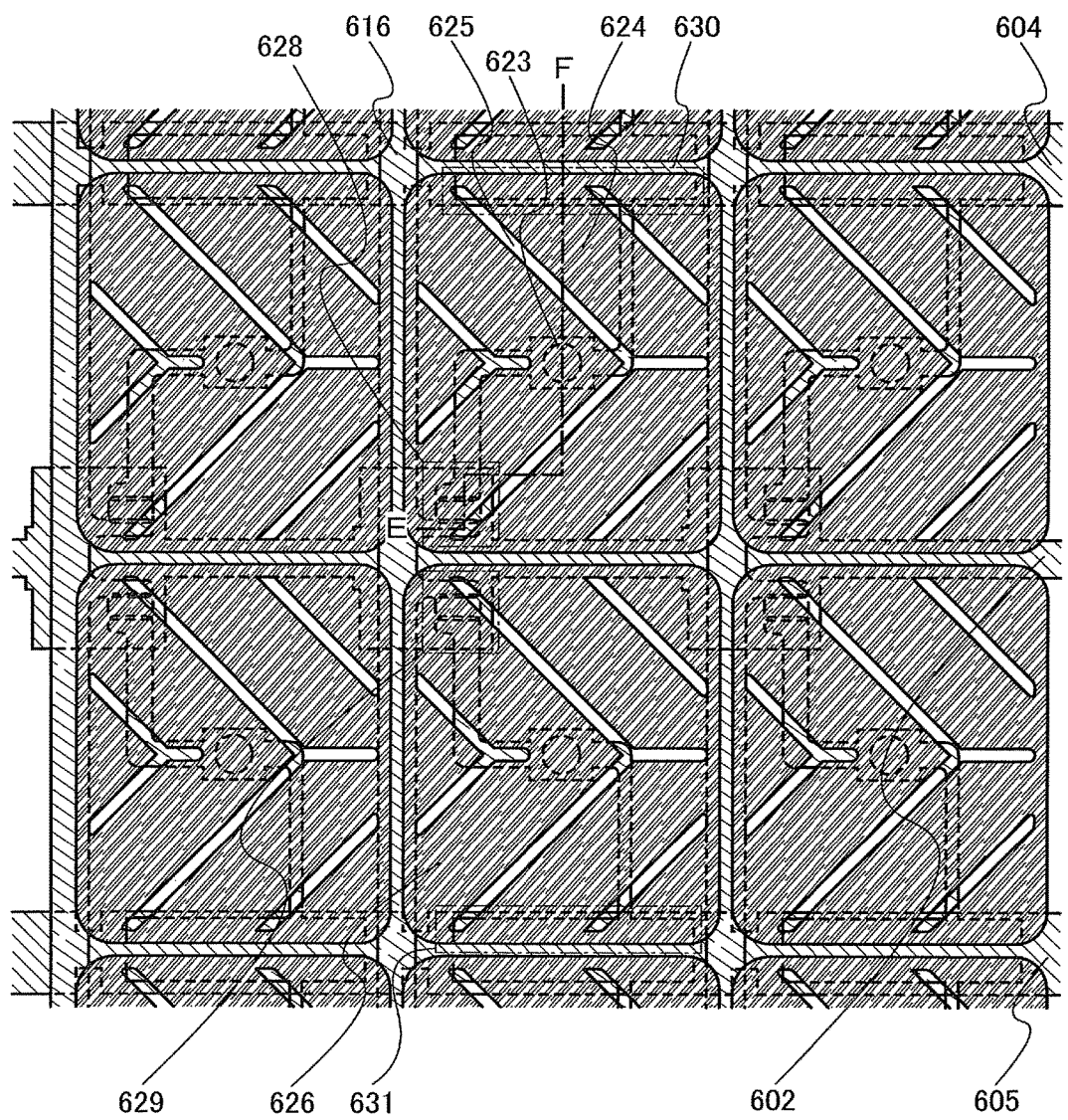
FIG. 18 illustrates a semiconductor device.
Figure 19:
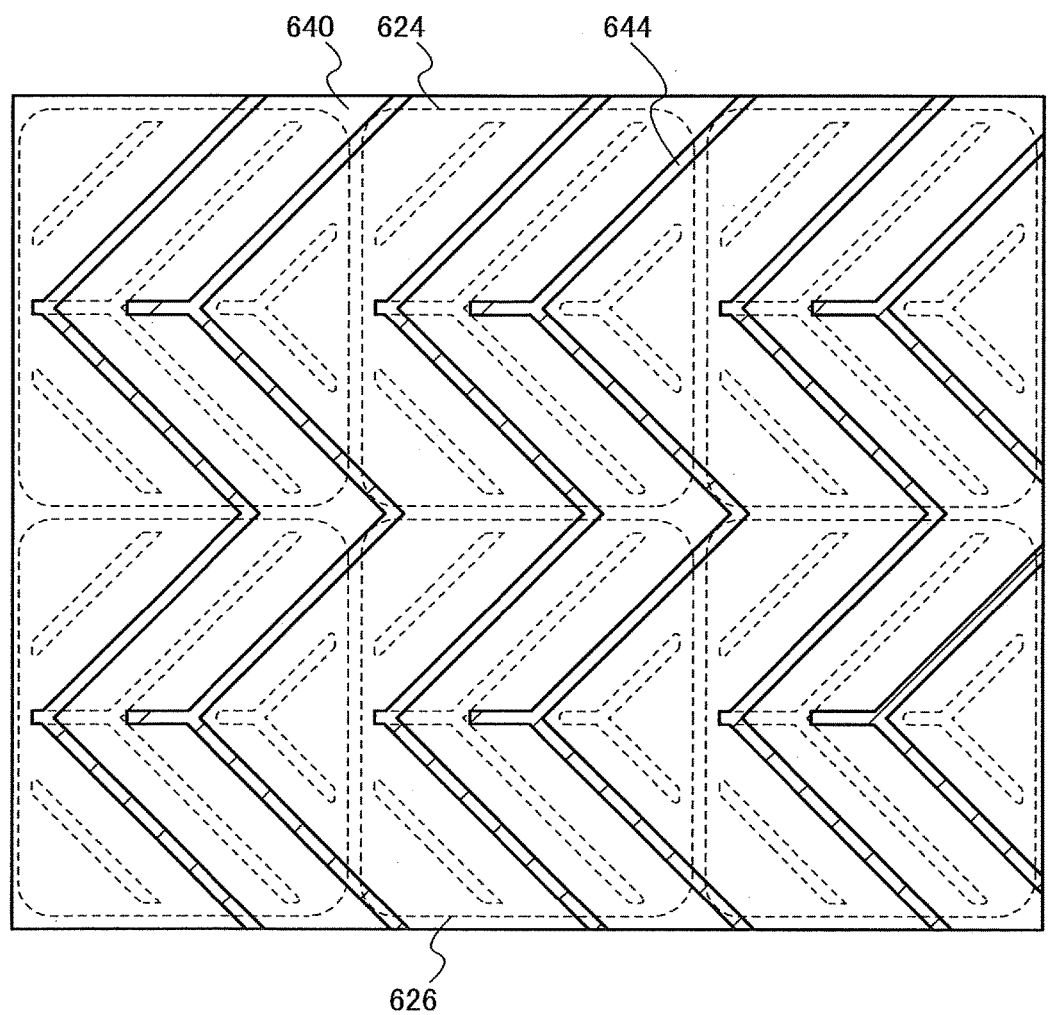
FIG. 19 illustrates a semiconductor device.

FIG. 18 and FIG. 19 illustrate a pixel electrode and a counter electrode, respectively. FIG. 18 is a plan view showing the substrate side where the pixel electrode is formed. FIG. 17 illustrates a cross-sectional structure taken along section line E-F in FIG. 18. FIG. 19 is a plan view showing the substrate side where the counter electrode is formed. Description below is made with reference to those drawings.

In FIG. 17, a substrate 600 over which a TFT 628, a pixel electrode 624 connected to the TFT 628, and a storage capacitor portion 630 are formed and a counter substrate 601 provided with a counter electrode 640 and the like overlap with each other, and liquid crystals are injected between the substrate 600 and the counter substrate 601.

Although not illustrated, a columnar spacer which is higher than a projection 644 is formed between the substrate 600 and the counter substrate 601 to make a distance (a cell gap) between the pixel electrode 624 and the counter electrode 640 constant. An alignment film 648 is formed over the pixel electrode 624. In a similar manner, the counter electrode 640 is provided with an alignment film 646. A liquid crystal layer 650 is formed between the alignment films 646 and 648.

Although a columnar spacer is used for the spacer here, bead spacers may be dispersed instead. Further, the spacer may also be formed over the pixel electrode 624 provided over the substrate 600.

The TFT 628, the pixel electrode 624 connected to the TFT 628, and the storage capacitor portion 630 are formed over the substrate 600. The pixel electrode 624 is connected to a wiring 618 through a contact hole 623 which penetrates an insulating layer 620 for covering the TFT 628, a wiring 616, and the storage capacitor portion 630 and also penetrates an insulating layer 622 for covering the insulating layer 620. The thin film transistor described in Embodiment 1 can be used as the TFT 628 as appropriate. Further, the storage capacitor portion 630 includes a first capacitor wiring 604 which is formed at the same time as a gate wiring 602 of the TFT 628; a gate insulating layer 606; and a second capacitor wiring 617 which is formed at the same time as the wirings 616 and 618.

The pixel electrode 624, the liquid crystal layer 650, and the counter electrode 640 overlap with each other, whereby a liquid crystal element is formed.

FIG. 18 illustrates a planar structure on the substrate 600. The pixel electrode 624 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The pixel electrode 624 can be formed using a conductive composition including a conductive macromolecule (also referred to as a conductive polymer). The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. As examples, polyaniline and a derivative thereof, polypyrrole and a derivative thereof, polythiophene and a derivative thereof, and a copolymer of two or more kinds of these materials are given.

The pixel electrode 624 is provided with slits 625. The slits 625 are provided for controlling the alignment of the liquid crystals.

A TFT 629, a pixel electrode 626 connected to the TFT 629, and a storage capacitor portion 631 which are illustrated in FIG. 18 can be formed in a similar manner to the TFT 628, the pixel electrode 624, and the storage capacitor portion 630, respectively. Both the TFTs 628 and 629 are connected to the wiring 616. One pixel of this liquid crystal display panel includes the pixel electrodes 624 and 626. The pixel electrodes 624 and 626 constitute subpixels.

FIG. 19 illustrates a planar structure of the counter substrate side. The counter electrode 640 is preferably formed using a material similar to that of the pixel electrode 624. The protrusions 644 which control the alignment of the liquid crystals are formed on the counter electrode 640.

Figure 20:
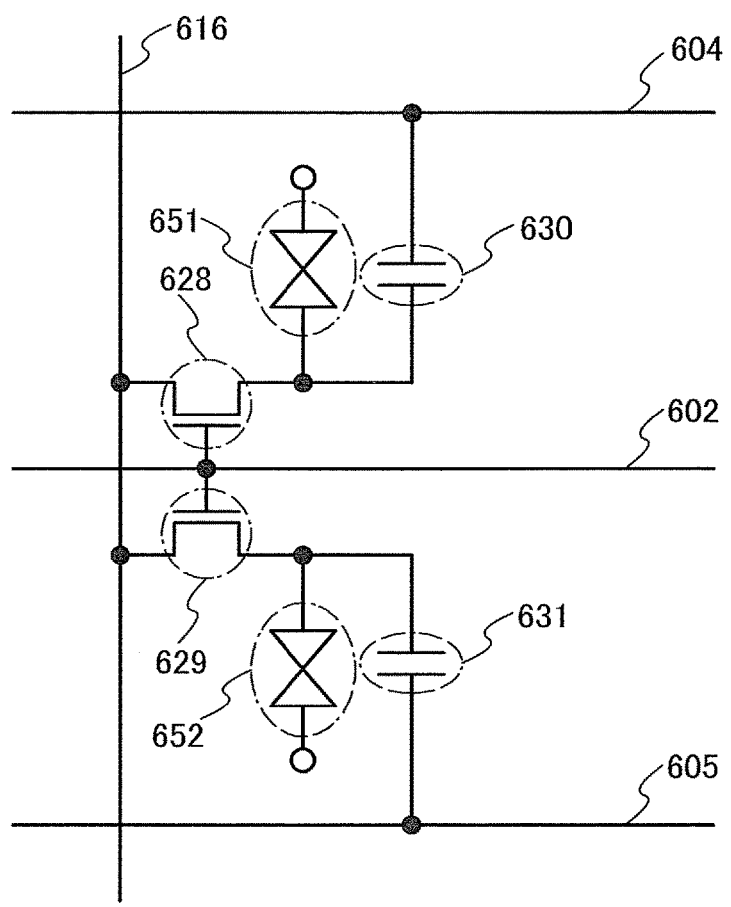
FIG. 20 is a circuit diagram illustrating a structure of a semiconductor device.

FIG. 20 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can vary. In other words, the alignment of the liquid crystals is precisely controlled and a viewing angle is increased by separate control of potentials of the capacitor wirings 604 and 605.

When a voltage is applied to the pixel electrode 624 provided with the slits 625, a distorted electric field (an oblique electric field) is generated in the vicinity of the slits 625. The protrusions 644 on the counter substrate 601 side and the slits 625 are alternately arranged so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIGS. 21 to 24.

Figure 21:
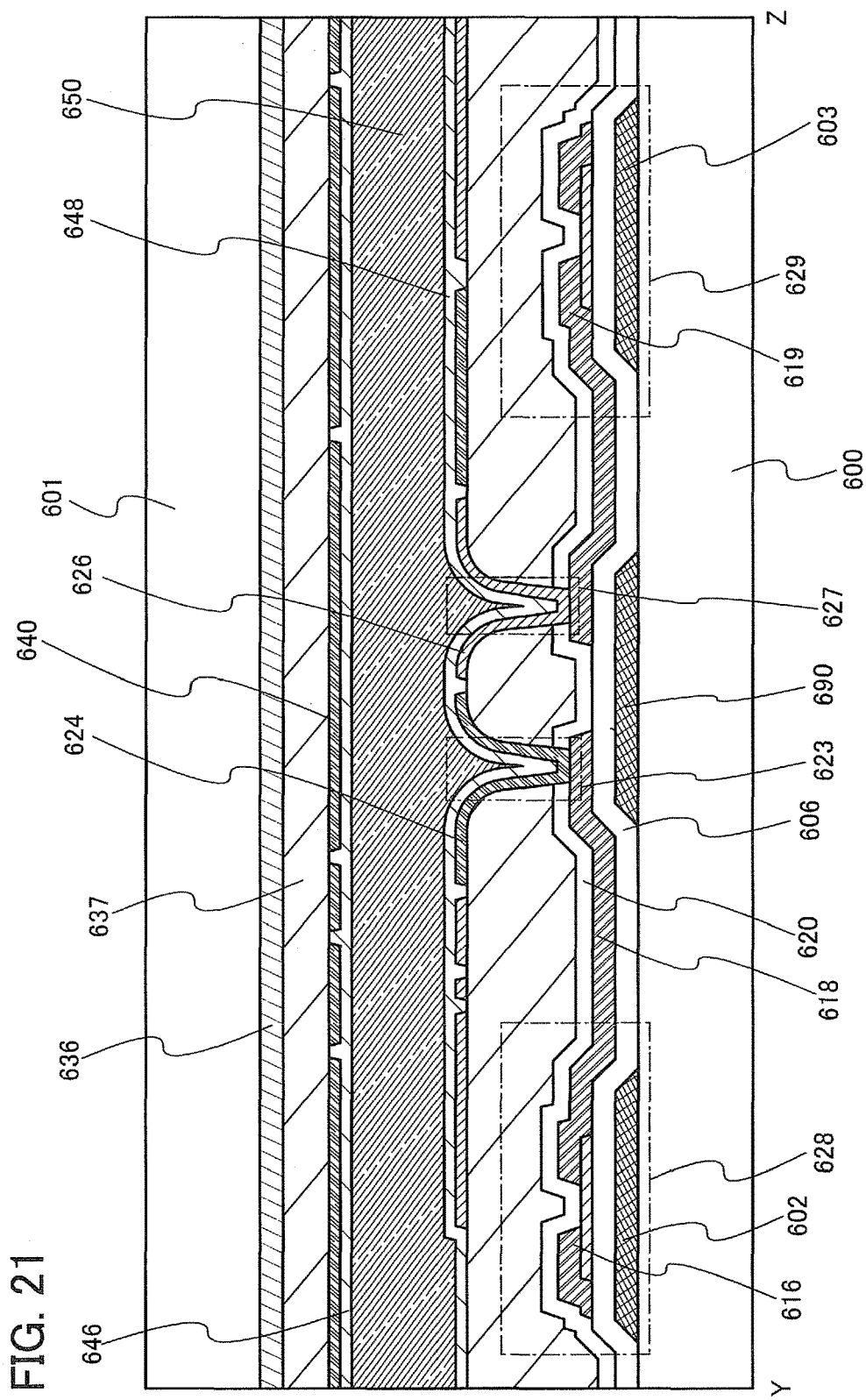
FIG. 21 illustrates a semiconductor device.
Figure 22:
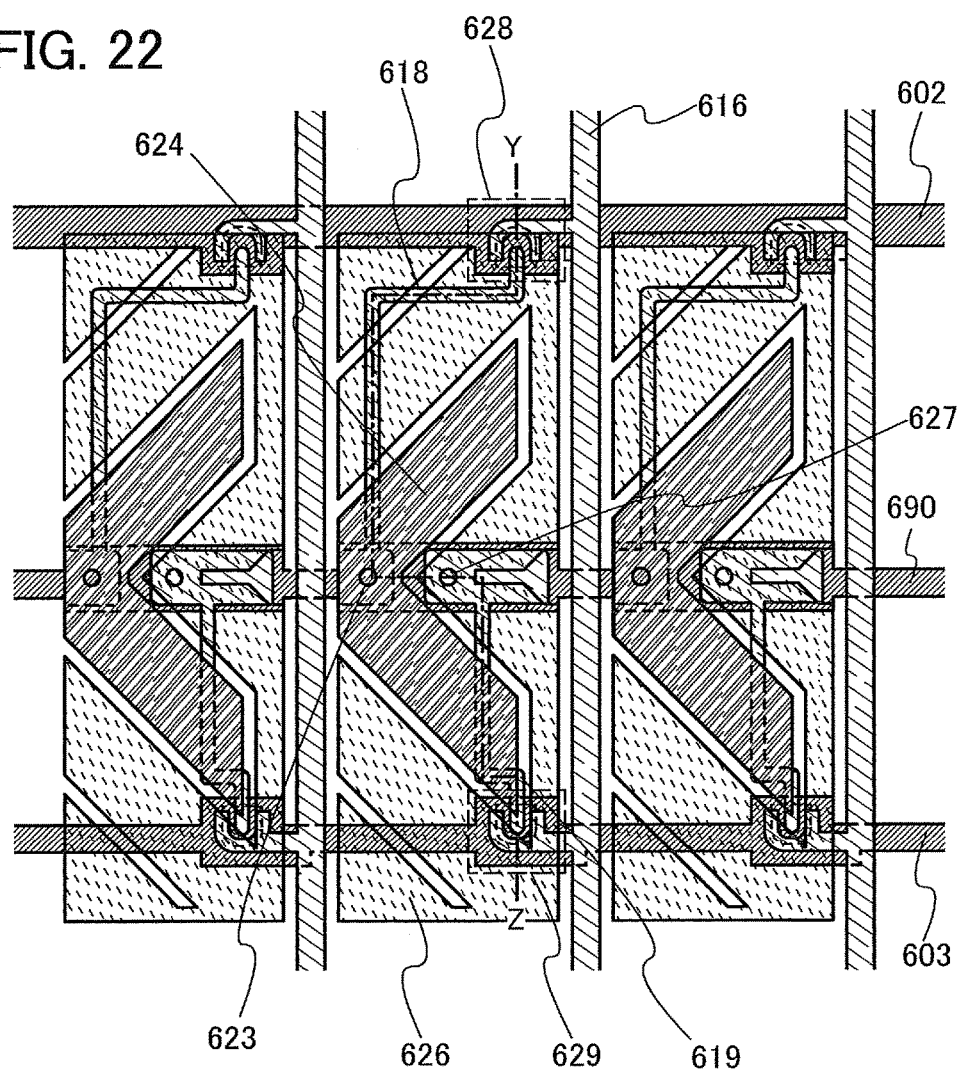
FIG. 22 illustrates a semiconductor device.

FIG. 21 and FIG. 22 illustrate a pixel structure of a VA liquid crystal display panel. FIG. 22 is a plan view of the substrate 600. FIG. 21 illustrates a cross-sectional structure taken along section line Y-Z in FIG. 22. Description below will be given with reference to both the drawings.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently of each other.

The pixel electrode 624 is connected to the TFT 628 through a wiring 618 in the contact hole 623. The pixel electrode 626 is connected to the TFT 629 through a wiring 619 in a contact hole 627. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistor described in Embodiment 1 can be used as appropriate as each of the TFTs 628 and 629. In addition, a capacitor wiring 690 is provided.

Figure 24:
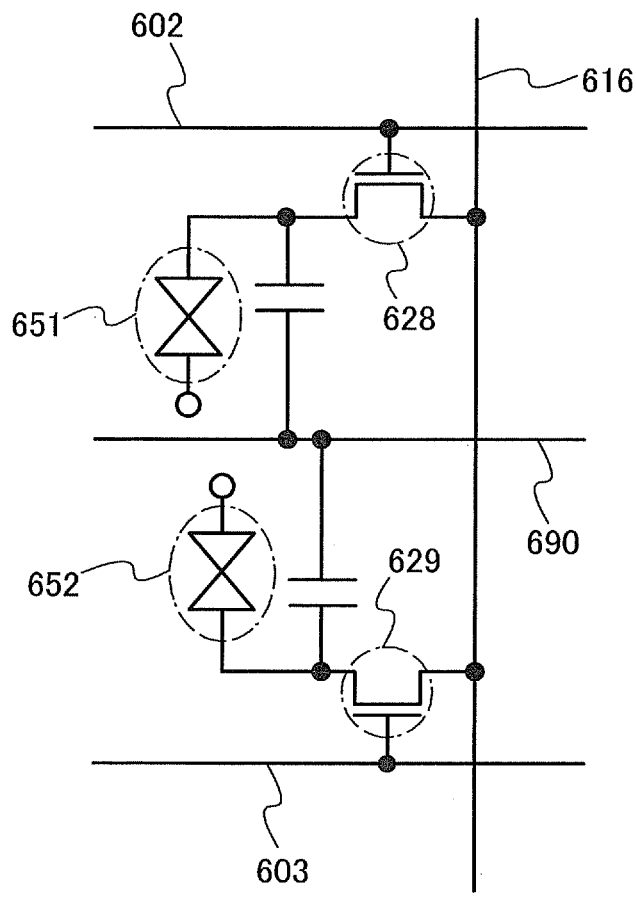
FIG. 24 is a circuit diagram illustrating a structure of a semiconductor device.

The shape of the pixel electrode 624 is different from that of the pixel electrode 626, and the pixel electrode 626 is formed so as to surround the external side of the pixel electrode 624 which spreads into a V shape. A voltage applied to the pixel electrode 624 by a TFT 628 is made to be different from a voltage applied to the pixel electrode 626 by a TFT 629, whereby alignment of liquid crystals is controlled. FIG. 24 illustrates an equivalent circuit of this pixel structure. The TFT 628 is connected to the gate wiring 602, and the TFT 629 is connected to the gate wiring 603. Both the TFTs 628 and 629 are connected to the wiring 616. A signal supplied to the gate wiring 602 and a signal supplied to the gate wiring 603 are separately controlled, whereby voltage applied to the liquid crystal element 651 and voltage applied to the liquid crystal element 652 can be different from each other. In other words, the operations of the TFTs 628 and 629 are controlled separately to precisely control the alignment of the liquid crystals in the liquid crystal elements 651 and 652, which leads to a wider viewing angle. In other words, the operations of the TFTs 628 and 629 are separately controlled, whereby the alignment of liquid crystals vary in the liquid crystal element 651 and the liquid crystal element 652 is realized, which leads to a wider viewing angle.

Figure 23:
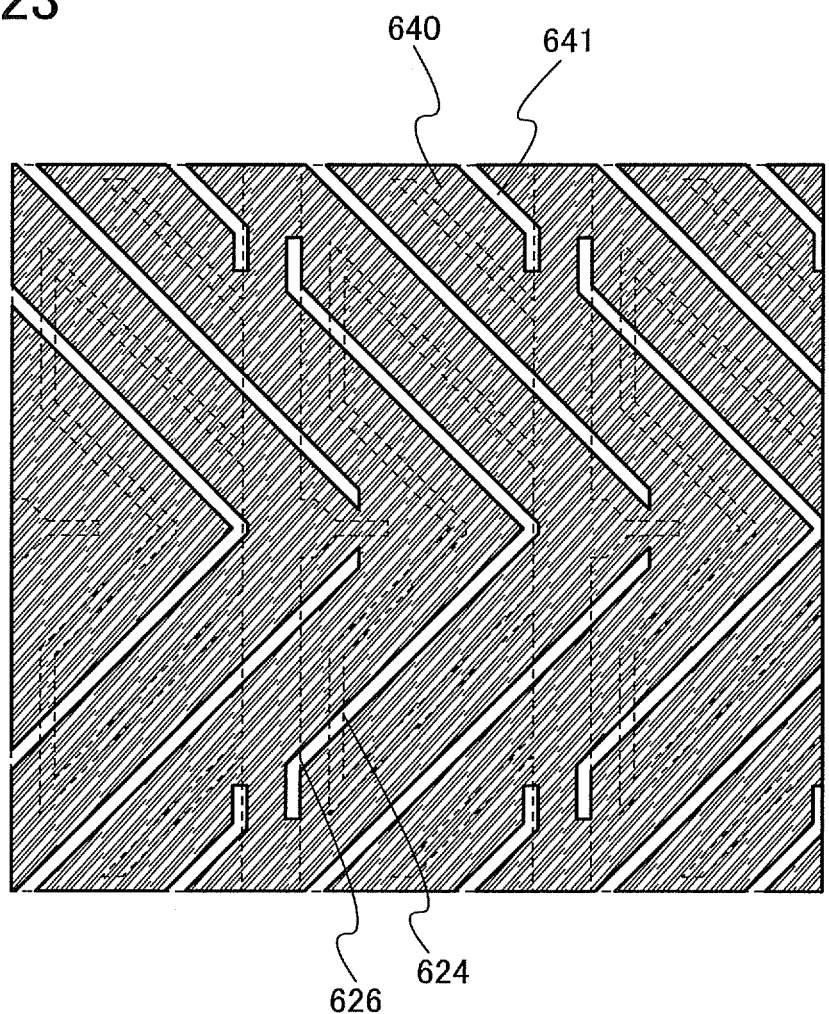
FIG. 23 illustrates a semiconductor device.

A counter substrate 601 is provided with a coloring layer 636 and a counter electrode 640. A planarization layer 637 is formed between the coloring layer 636 and the counter electrode 640 to prevent alignment disorder of the liquid crystals. FIG. 23 illustrates a structure of the counter substrate side. The counter electrode 640 is an electrode shared by different pixels and slits 641 are formed. The slits 641 and the slits 625 on the pixel electrode 624 side and the pixel electrode 626 side are alternately arranged so that an oblique electric field is effectively generated, whereby the alignment of the liquid crystals can be controlled. Accordingly, the alignment of the liquid crystals can vary in different locations, which leads to a wider viewing angle. Note that in FIG. 23, the pixel electrodes 624 and 626 formed over the substrate 600 are represented by dashed lines and the counter electrode 640 and the pixel electrodes 624 and 626 overlap with each other.

An alignment film 648 is formed over the pixel electrode 624 and the pixel electrode 626, and the counter electrode 640 is similarly provided with an alignment film 646. A liquid crystal layer 650 is formed between the substrate 600 and a counter substrate 601.

The pixel electrode 624, the liquid crystal layer 650, and the counter electrode 640 overlap with each other, whereby a first liquid crystal element is formed. Further, the pixel electrode 626, the liquid crystal layer 650, and the counter electrode 640 overlap with each other, whereby a second liquid crystal element is formed. The pixel structure of the display panel illustrated in FIGS. 21, 22, 23, and 24 is a multi-domain structure in which the first liquid crystal element and the second liquid crystal element are provided in one pixel.

Although the VA liquid crystal display device is described as a liquid crystal display device including the thin film transistor described in Embodiment 1, an IPS liquid crystal display device, a TN liquid crystal display device, or the like can be used.

Thin film transistors in a pixel portion of the liquid crystal display device are manufactured by the manufacturing method of the thin film transistor which is described in Embodiment 1, whereby display unevenness caused by variation in threshold voltage of the thin film transistors in pixels can be suppressed.

Embodiment 7

Figure 25:
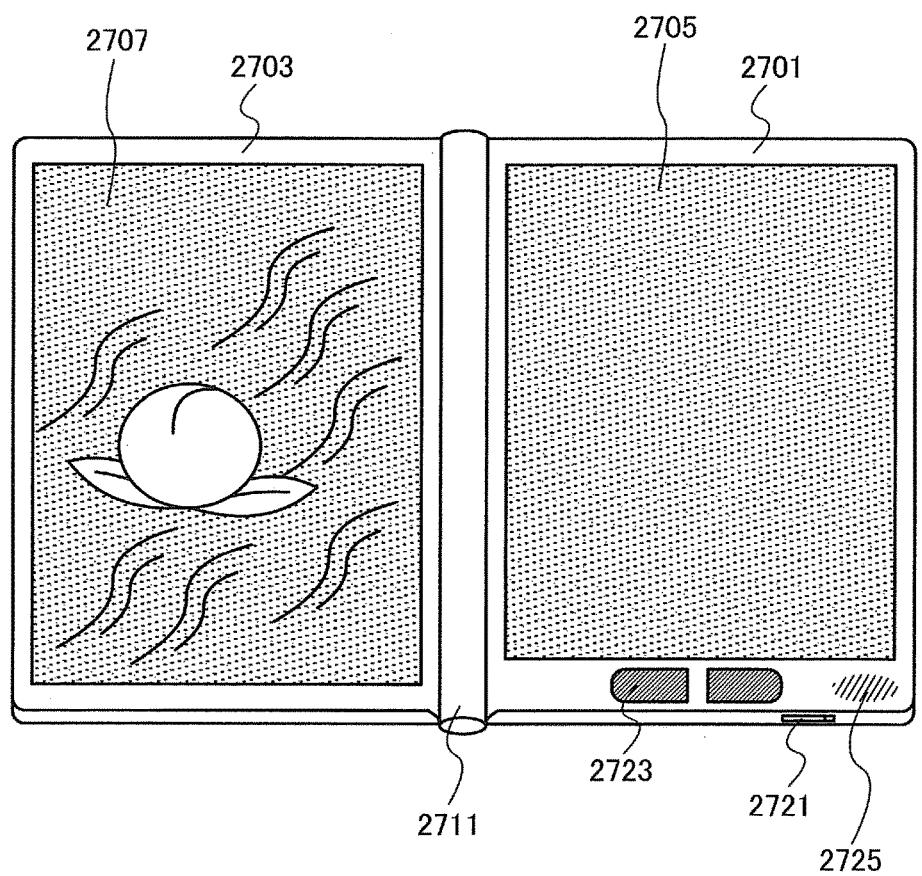
FIG. 25 illustrates an example of an e-book reader.

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 25 illustrates an example of the electronic devices.

FIG. 25 illustrates an e-book reader 2700. For example, the e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 25 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

Embodiment 8

A semiconductor device disclosed in this specification can be applied to a variety of electronic devices (including game machines). Examples of such electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 26A:
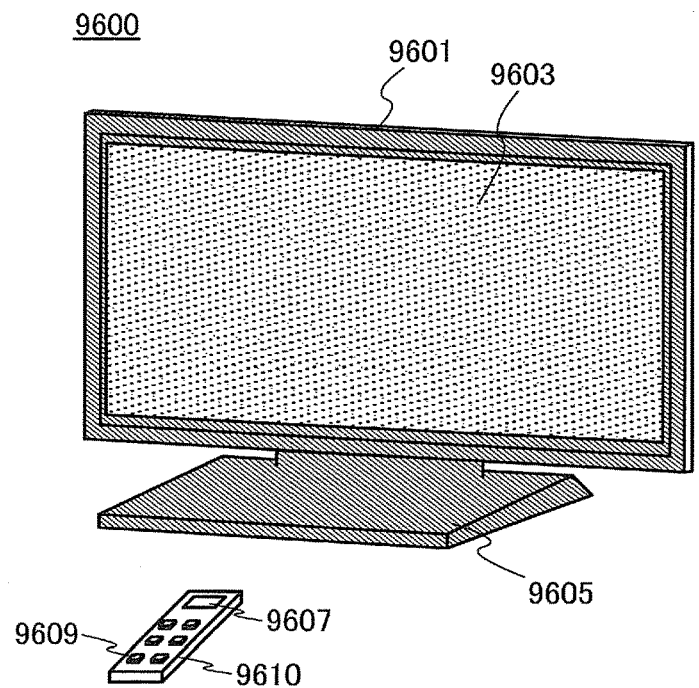
FIGS. 26A and 26B illustrate examples of a television set and a digital photo frame, respectively.

FIG. 26A illustrates an example of television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

Figure 26B:
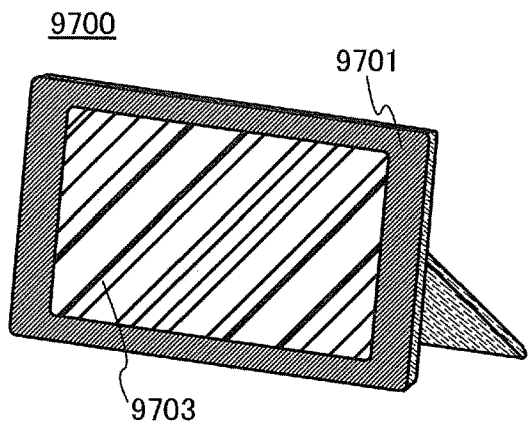

FIG. 26B illustrates an example of digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 27A:
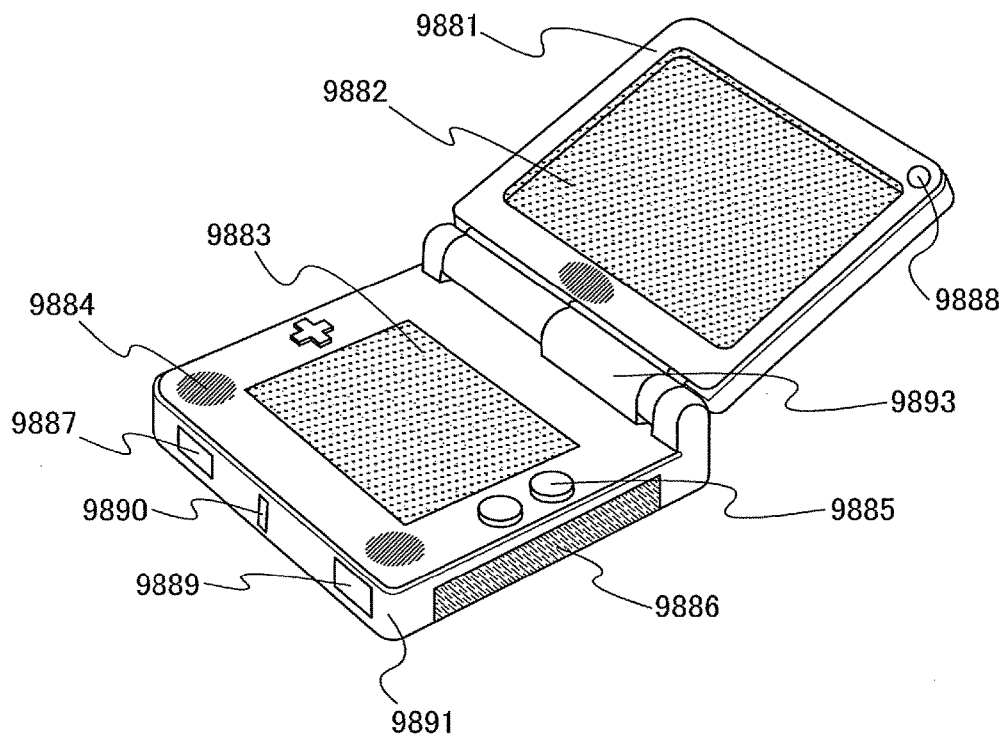
FIGS. 27A and 27B illustrate examples of game machines.

FIG. 27A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 27A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include an additional accessory as appropriate. The portable game machine illustrated in FIG. 27A has a function of reading a program or data stored in the recording medium to display it on the display portion, and a function of sharing data with another portable game machine by wireless communication. Note that a function of the portable game machine illustrated in FIG. 27A is not limited to those described above, and the portable game machine can have a variety of functions.

Figure 27B:
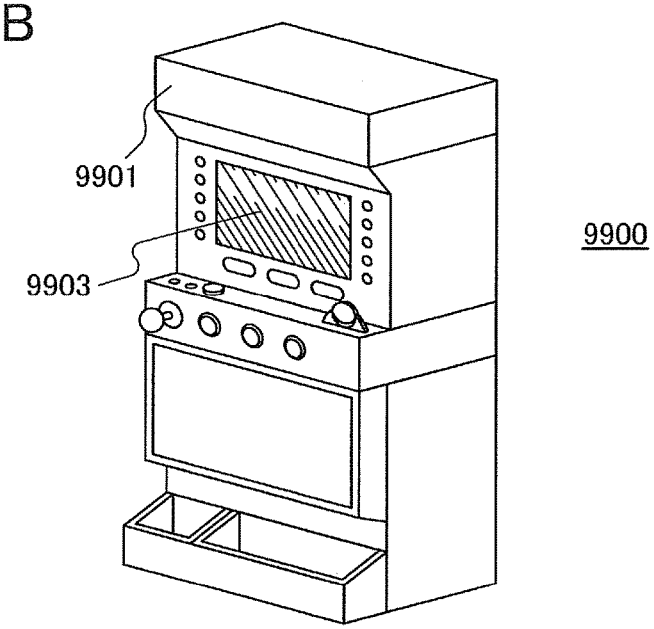

FIG. 27B illustrates a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 28A:
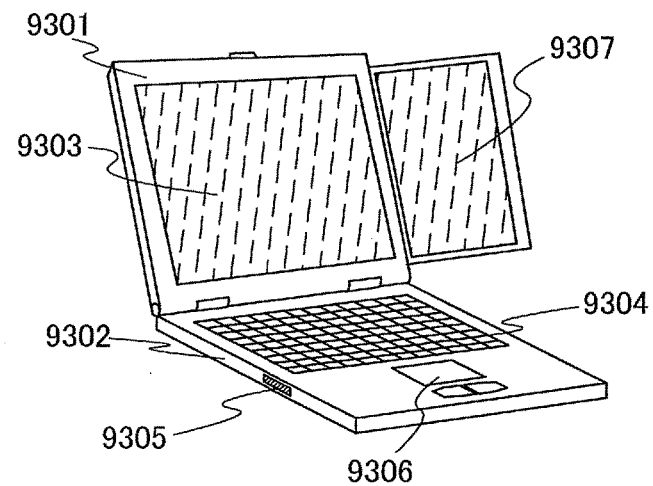
FIGS. 28A and 28B illustrate examples of a portable computer and a portable phone, respectively.

FIG. 28A is a perspective view illustrating an example of portable computer.

In the portable computer illustrated in FIG. 28A, a top housing 9301 having a display portion 9303 and a bottom housing 9302 having a keyboard 9304 can overlap with each other by closing a hinge unit which connects the top housing 9301 and the bottom housing 9302. Thus, the portable computer is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stowed in the top housing 9301 by being slid therein. With the display portion 9307, a large display screen can be realized. In addition, the user can adjust the angle of a screen of the stowable display portion 9307. If the stowable display portion 9307 is a touch panel, the user can input data by touching part of the display portion 9307.

The display portion 9303 or the stowable display portion 9307 is formed using an image display device such as a liquid crystal display panel or a light-emitting display panel using an organic light-emitting element, an inorganic light-emitting element, or the like.

In addition, the portable computer illustrated in FIG. 28A can be provided with a receiver and the like and can receive a TV broadcast to display an image on the display portion 9303 or the display portion 9307. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 28B:
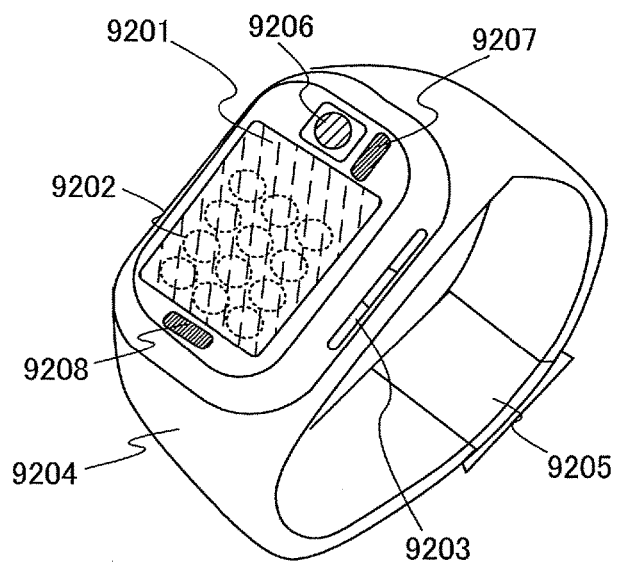

FIG. 28B is a perspective view of an example of a portable phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 28B, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The portable phone illustrated in FIG. 28B is provided with a receiver of a TV broadcast and the like, and can display an image on the display portion 9201 by receiving the TV broadcast. In addition, the mobile phone is provided with a memory device such as a memory, and the like, and can record the TV broadcast in the memory. The portable phone illustrated in FIG. 28B may have a function of collecting location information such as GPS.

An image display device such as a liquid crystal display panel or a light-emitting display panel using an organic light-emitting element, an inorganic light-emitting element, or the like is used as the display portion 9201. The portable phone illustrated in FIG. 28B is compact and lightweight and the battery capacity is limited. For the above reason, a panel which can be driven with low power consumption is preferably used as a display device for the display portion 9201.

Note that, although FIG. 28B illustrates the electronic device which is worn on the wrist, this embodiment is not limited thereto as long as an electronic is portable.

Example 1

In this example, a thin film transistor was manufactured by the manufacturing method which is described in Embodiment 1. Evaluation results of the amount of change in $V_{th}$ before and after a BT test are shown.

In this example, thin film transistors each of which had a channel length L of 3 μm and a channel width W of 20 μm were manufactured over one substrate. First, a method for manufacturing the thin film transistor is described.

First, as a base layer, by a CVD method, a silicon nitride layer was formed over a glass substrate and a silicon oxynitride layer was formed over the silicon nitride layer. Over the silicon oxynitride layer, a tungsten layer was formed as a gate electrode layer by a sputtering method. Here, the tungsten layer was selectively etched so that the gate electrode layer was formed.

Next, over the gate electrode layer, a silicon oxynitride layer with a thickness of 100 nm was formed as a gate insulating layer by a CVD method.

Next, over the gate insulating layer, an oxide semiconductor layer with a thickness of 30 nm was formed using an In—Ga—Zn—O-based oxide semiconductor target ($In_2O_3$: $Ga_2O_3$:ZnO=1:1:1 in a molar ratio) having a relative density of an oxide semiconductor of 85% by a sputtering method. Here, the oxide semiconductor layer was selectively etched so that an island-shaped oxide semiconductor layer was formed.

Next, first heat treatment was performed on the oxide semiconductor layer at 650° C. for 6 minutes in a nitrogen atmosphere by a GRTA method.

Next, as a source and drain electrode layers, a 100-nm-thick titanium layer, a 200-nm-thick aluminum layer, and a 100-nm-thick titanium layer were stacked over the oxide semiconductor layer by a sputtering method. Here, the source and drain electrode layers were selectively etched so that the channel length L and the channel width W of the thin film transistor were 3 μm and 20 μm, respectively.

Next, as a protective insulating layer, a silicon oxide layer was formed so as to be in contact with the oxide semiconductor layer by a reactive sputtering method. Here, the silicon oxide layer that was the protective layer was selectively etched so that an opening was formed over the gate electrode layer and the source and drain electrode layers. After that, second heat treatment was performed at 250° C. for one hour in a nitrogen atmosphere.

Through the above-described steps, the thin film transistor was manufactured.

Subsequently, a BT test was performed on the thin film transistor manufactured in this example. The BT test is a kind of acceleration test, by which a change in characteristics of the thin film transistor that is caused by long-term use can be evaluated in a short time. In particular, the amount of change in threshold voltage of the thin film transistor before and after the BT test is an important indicator for examining reliability. A smaller amount of change in the threshold voltage of the thin film transistor before and after the BT test means high reliability of the thin film transistor.

Specifically, while the temperature of a substrate (substrate temperature) over which a thin film transistor is formed is maintained at a constant temperature and potentials of a source and a drain of the thin film transistor are set to the same potential, a potential which is different from that of the source and drain is applied to a gate of the thin film transistor for a certain period of time. The substrate temperature may be set as appropriate in accordance with the test purpose. A BT test in which a potential applied to a gate is higher than potentials of a source and a drain is referred to as a +BT test and a BT test in which a potential applied to a gate is lower than potentials of a source and a drain is referred to as a −BT test.

The stress conditions for the BT test can be determined in accordance with a substrate temperature, intensity of electric field applied to a gate insulating layer, and a time period of application of electric field. The intensity of the electric field applied to the gate insulating layer is determined in accordance with a value obtained by dividing a potential difference between the gate and the source and drain by the thickness of the gate insulating layer. For example, in the case where the intensity of the electric field applied to the gate insulating layer with a thickness of 100 nm is to be 2 MV/cm, the potential difference may be set to 20 V.

Note that voltage refers to a difference in potential between two points, and potential refers to electrostatic energy (potential energy) of a unit charge at a given point in an electrostatic field. Note that in general, a difference between potential of one point and reference potential is merely called potential or voltage, and potential and voltage are used as synonymous words in many cases. Therefore, in this specification, potential may be rephrased as voltage and voltage may be rephrased as potential unless otherwise specified.

Both the +BT test and the −BT test were performed under the following conditions: the substrate temperature was 150° C.; the intensity of an electric field applied to the gate insulating layer was 2 MV/cm; and the time for application was one hour.

First, the +BT test is described. In order to measure initial characteristics of thin film a transistor subjected to the BT test, a change in characteristics of source-drain current (hereinafter referred to as drain current or $I_d$) was measured under conditions that the substrate temperature was set to 40° C., the voltage between a source and a drain (hereinafter, referred to as drain voltage or $V_d$) was set to 10 V, and the voltage between the source and a gate (hereinafter referred to as gate voltage or $V_g$) was changed from −20 V to +20 V. In other words, $V_g$-$I_d$ characteristics were measured. Here, as a countermeasure against moisture absorption onto surfaces of a sample, the substrate temperature was set to 40° C. However, the measurement may be performed at room temperature (25° C.) if there is no particular problem.

Next, after the substrate temperature was increased to 150° C., the potential of the source and drain of the thin film transistor was set to 0 V. Then, voltage was applied to the gate so that the intensity of an electric field applied to the gate insulating layer was 2 MV/cm. Since the thickness of the gate insulating layer in the thin film transistor was 100 nm here, a voltage of +20 V was kept being applied to the gate for one hour. Although the time for voltage application was one hour here, the time may be determined as appropriate in accordance with the purpose.

Next, the substrate temperature was decreased to 40° C. while voltage was continuously applied to the gate and the source and drain. In that case, if the application of voltage is stopped before the substrate temperature is completely decreased, damage which is given to the thin film transistor in the BT test is repaired due to remaining heat; thus, the substrate temperature needs to be decreased while voltage is applied. After the substrate temperature was decreased to 40° C., the application of the voltage was stopped. Strictly, the time taken for temperature drop needs to be added to the time for voltage application; however, the temperature was actually able to be decreased to 40° C. in several minutes, and therefore this is taken as an error range and the time taken for temperature drop is not added to the time for voltage application.

Then, $V_g$-$I_d$ characteristics were measured under the same conditions as those for the measurement of the initial characteristics, so that the $V_g$-$I_d$ characteristics after the +BT test were obtained.

Next, the −BT test is described. The −BT test was performed with the procedure similar to the +BT test, but has a different point from the +BT test, in that the voltage applied to the gate after the substrate temperature is increased to 150° C. is set to −20 V.

Note that it is important that a BT test be performed on a thin film transistor which has never been subjected to a BT test. For example, when a −BT test is performed on a thin film transistor which has already been subjected to a +BT test, results of the −BT test cannot be evaluated correctly due to the influence of the +BT test which has been performed earlier. Further, the same can be said for the case where a +BT test is performed again on a thin film transistor which has already been subjected to a +BT test. Note that the same cannot be said for the case where a BT test is intentionally repeated in consideration of such an influence.

Figure 29:
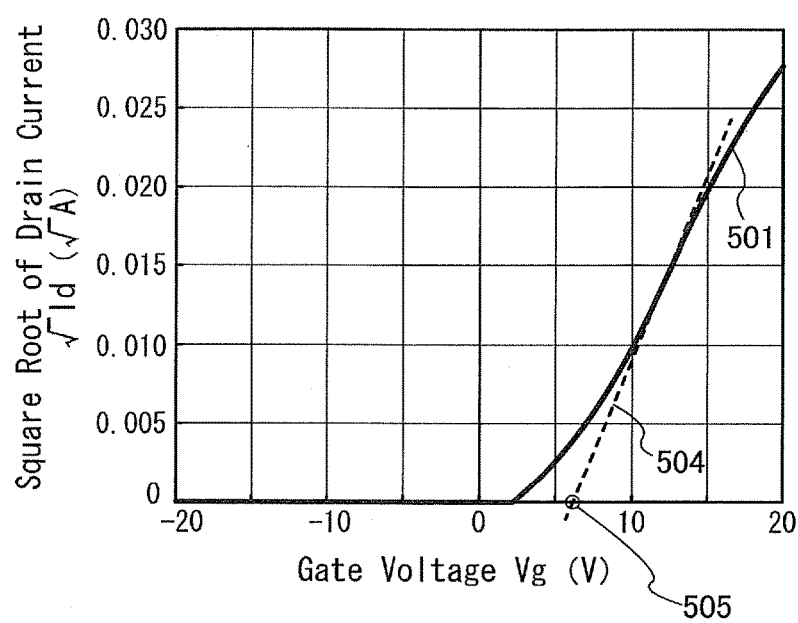
FIG. 29 is a graph for defining $V_{th}$.

Here, the definition of $V_{th}$ in this specification is described. In FIG. 29, the horizontal axis represents gate voltage on a linear scale and the vertical axis represents square root of drain current (hereinafter also referred to as $\sqrt{I_d}$) on a linear scale. A curve 501 represents square root of drain current with respect to a change in the gate voltage and is a curve (hereinafter also referred to as a $\sqrt{I_d}$ curve) representing square root of $I_d$ of a $V_g$-$I_d$ curve measured under such a condition that $V_d$ was 10 V.

First, the $\sqrt{I_d}$ curve (the curve 501) is obtained from the $V_g$-$I_d$ curve measured under such a condition that $V_d$ was 10 V. Then, a tangent 504 of a point on the $\sqrt{I_d}$ curve at which a differential value of the $\sqrt{I_d}$ curve becomes maximum is obtained. Next, $V_g$ at the time when the tangent 504 is extended and $I_d$ becomes 0 A on the tangent 504, that is, the value of gate voltage axis intercept 505 is defined as $V_{th}$.

Figure 30A:
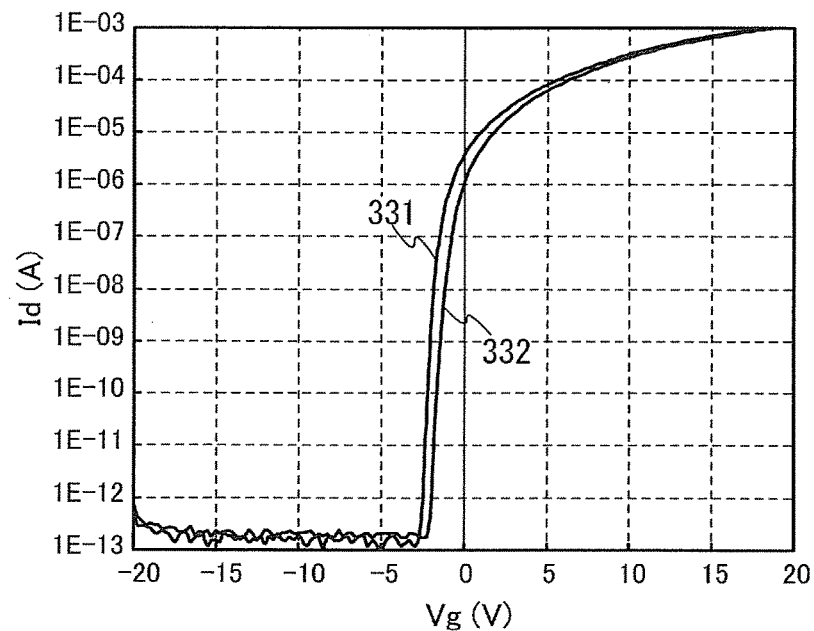
FIGS. 30A and 30B show results of a BT test performed on a thin film transistor in Example 1.
Figure 30B:
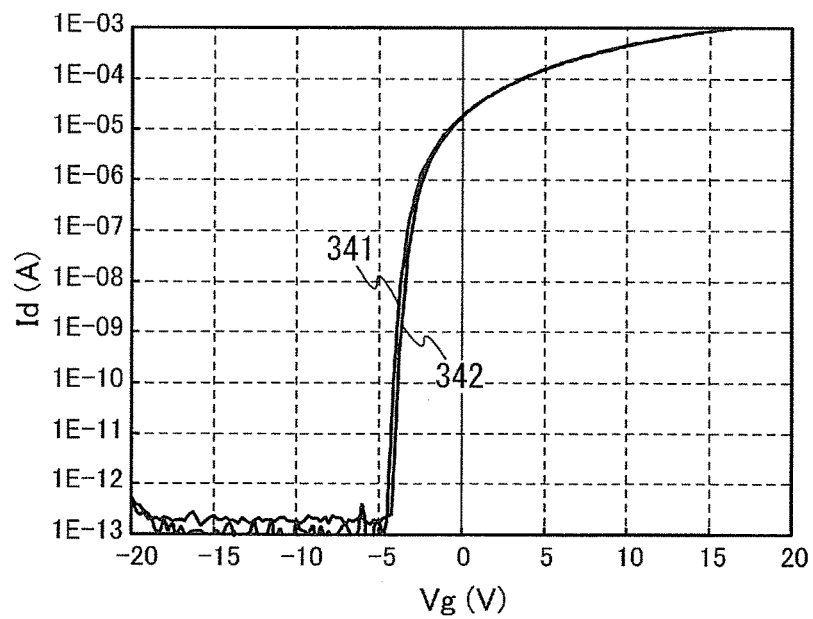

FIGS. 30A and 30B each show $V_g$-$I_d$ characteristics of the thin film transistor before and after the BT test. In both FIGS. 30A and 30B, the horizontal axis represents gate voltage ($V_g$) and the vertical axis represents drain current ($I_d$) with respect to the gate voltage on a logarithmic scale.

FIG. 30A shows the $V_g$-$I_d$ characteristics of the thin film transistor before and after the +BT test. Initial characteristics 331 represents the $V_g$-$I_d$ characteristics of the thin film transistor before the +BT test and +BT 332 represents the $V_g$-$I_d$ characteristics of the thin film transistor after the +BT test.

FIG. 30B shows the $V_g$-$I_d$ characteristics of the thin film transistor before and after the −BT test. Initial characteristics 341 represent the $V_g$-$I_d$ characteristics of the thin film transistor before the −BT test, and −BT 342 represents the $V_g$-$I_d$ characteristics of the thin film transistor after the −BT test.

In FIG. 30A, the threshold voltage of the +BT 332 is shifted from that of the initial characteristics 331 in a positive direction by 0.72 V. In FIG. 30B, the threshold voltage of the −BT 342 is shifted from that of the initial characteristics 341 in a positive direction by 0.04 V In both the BT tests, the amount of change in the threshold voltage is less than or equal to 1 V, which confirms that the thin film transistor manufactured in accordance with Embodiment 1 has high reliability.

Here, results of a BT test performed on a conventional thin film transistor are described. The conventional thin film transistor is a channel-etched thin film transistor like the thin film transistor in Embodiment 1. Although not particularly illustrated, in the conventional thin film transistor, a base insulating layer is formed over a glass substrate; a gate electrode layer is formed over the base insulating layer; a silicon oxynitride layer with a thickness of 100 nm is formed as a gate insulating layer over the gate electrode layer by a CVD method; an oxide semiconductor layer with a thickness of 20 nm is formed over the gate insulating layer with the use of an In—Ga—Zn—O-based oxide semiconductor target ($In_2O_3$:$Ga_2O_3$:ZnO=1:1:1 in a molar ratio) having a relative density of an oxide semiconductor of 85% by a sputtering method; a source and drain electrodes are formed over the oxide semiconductor layer; and as a protective insulating layer, a silicon oxynitride layer is formed over the source and drain electrodes so as to be in contact with part of the oxide semiconductor layer by a CVD method. Note that first heat treatment is not performed on the conventional thin film transistor.

Figure 31A:
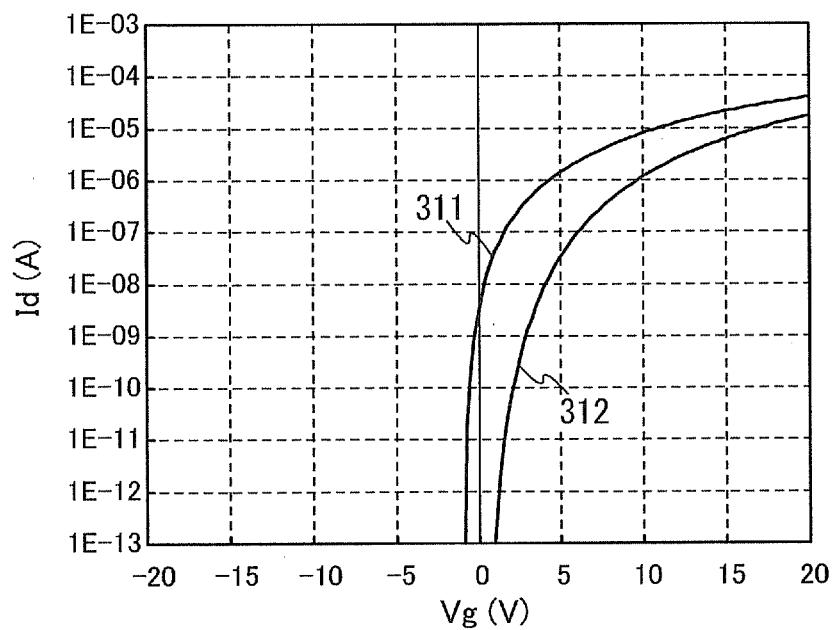
FIGS. 31A and 31B show results of a BT test performed on a conventional thin film transistor.
Figure 31B:
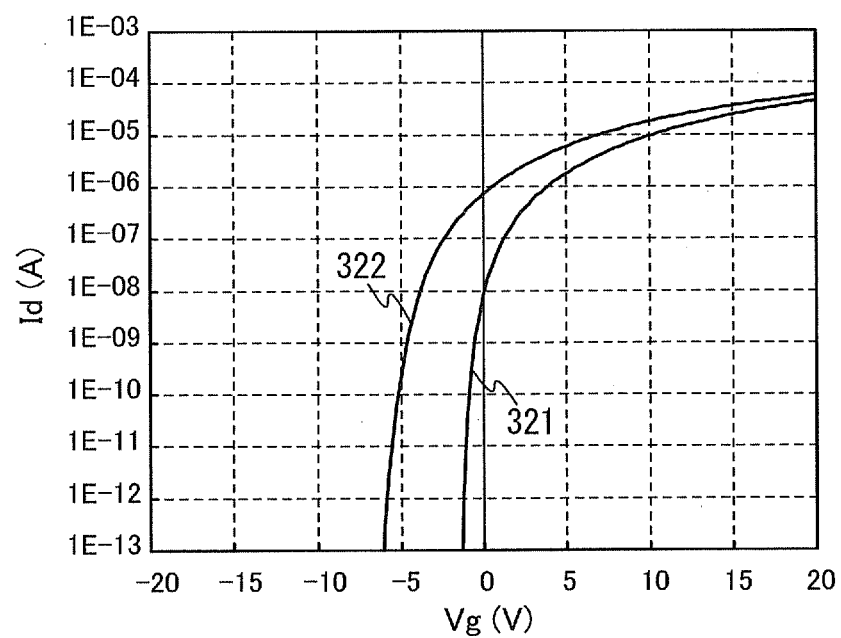

FIGS. 31A and 31B each show $V_g$-$I_d$ characteristics of the conventional thin film transistor before and after the BT test. In the measurement of the $V_g$-$I_d$ characteristics of the conventional thin film transistor used in this example, $I_d$ was less than or equal to a lower detection limit of a measurement device in an off region (in general, a region where $V_g$ ranges from about 0 V to negative voltage in the case of an n-channel transistor). Therefore, FIGS. 31A and 31B do not show a part in which $I_d$ is less than or equal to the lower detection limit of the measurement device.

FIG. 31A shows the $V_g$-$I_d$ characteristics of the conventional thin film transistor before and after the +BT test. Initial characteristics 311 represents the $V_g$-$I_d$ characteristics of the conventional thin film transistor before the +BT test and +BT 312 represents the $V_g$-$I_d$ characteristics after the +BT test.

FIG. 31B shows the $V_g$-$I_d$ characteristics of the conventional thin film transistor before and after the −BT test. Initial characteristics 321 represents the $V_g$-$I_d$ characteristics of the conventional thin film transistor before the −BT test and −BT 322 represents the $V_g$-$I_d$ characteristics after the −BT test.

In FIG. 31A, the threshold voltage of the +BT 312 is shifted from that of the initial characteristics 311 in a positive direction by 5.7 V. In FIG. 31B, the threshold voltage of the −BT 322 is shifted from that of the initial characteristics 321 in a negative direction by 3.4 V.

This application is based on Japanese Patent Application serial no. 2009-218904 filed with Japan Patent Office on Sep. 24, 2009, the entire contents of which are hereby incorporated by reference.

The invention claimed is:

1. A method for manufacturing a semiconductor device, comprising the steps of:
   forming a gate electrode layer over a substrate having an insulating surface;
   forming a gate insulating layer over the gate electrode layer;
   forming an oxide semiconductor layer over the gate insulating layer;
   performing a first heat treatment after the oxide semiconductor layer is formed;

forming a source electrode layer and a drain electrode layer over the oxide semiconductor layer after performing the first heat treatment;

forming an inorganic insulating layer over the gate insulating layer, the oxide semiconductor layer, the source electrode layer, and the drain electrode layer, wherein the inorganic insulating layer is in contact with part of the oxide semiconductor layer and entirely covers the source electrode layer and the drain electrode layer; and performing a second heat treatment after the inorganic insulating layer is formed, wherein a temperature of the second heat treatment is lower than a temperature of the first heat treatment, wherein the inorganic insulating layer comprises a silicon oxide layer, a silicon nitride oxide layer, a silicon nitride layer, an aluminum oxide layer, or an aluminum oxynitride layer, and wherein the oxide semiconductor layer is crystallized after the first heat treatment.

2. The method for manufacturing a semiconductor device according to claim 1, wherein the temperature of the first heat treatment is higher than or equal to 350° C. and lower than or equal to 750° C.

3. The method for manufacturing a semiconductor device according to claim 1, wherein the oxide semiconductor layer comprises indium and zinc.

4. The method for manufacturing a semiconductor device according to claim 1, wherein the oxide semiconductor layer is crystallized to be a microcrystalline layer after the first heat treatment.

5. The method for manufacturing a semiconductor device according to claim 1, wherein the oxide semiconductor layer is crystallized to be a polycrystalline layer after the first heat treatment.

6. A method for manufacturing a semiconductor device, comprising the steps of:

forming a gate electrode layer over a substrate having an insulating surface;

forming a gate insulating layer over the gate electrode layer;

forming an oxide semiconductor layer over the gate insulating layer;

performing a first heat treatment in a nitrogen atmosphere after the oxide semiconductor layer is formed;

forming a source electrode layer and a drain electrode layer over the oxide semiconductor layer after performing the first heat treatment;

forming an inorganic insulating layer over the gate insulating layer, the oxide semiconductor layer, the source electrode layer, and the drain electrode layer, wherein the inorganic insulating layer is in contact with part of the oxide semiconductor layer and entirely covers the source electrode layer and the drain electrode layer; and performing a second heat treatment after the inorganic insulating layer is formed, wherein a temperature of the second heat treatment is lower than a temperature of the first heat treatment, wherein the inorganic insulating layer comprises a silicon oxide layer, a silicon nitride oxide layer, a silicon nitride layer, an aluminum oxide layer, or an aluminum oxynitride layer, and wherein the oxide semiconductor layer is crystallized after the first heat treatment.

7. The method for manufacturing a semiconductor device according to claim 6, wherein the temperature of the first heat treatment is higher than or equal to 350° C. and lower than or equal to 750° C.

8. The method for manufacturing a semiconductor device according to claim 6, wherein the oxide semiconductor layer comprises indium and zinc.

9. The method for manufacturing a semiconductor device according to claim 6, wherein the oxide semiconductor layer is crystallized to be a microcrystalline layer after the first heat treatment.

10. The method for manufacturing a semiconductor device according to claim 6, wherein the oxide semiconductor layer is crystallized to be a polycrystalline layer after the first heat treatment.

11. A method for manufacturing a semiconductor device, comprising the steps of:

forming a gate electrode layer over a substrate having an insulating surface;

forming a gate insulating layer over the gate electrode layer;

forming an oxide semiconductor layer over the gate insulating layer;

performing a first heat treatment after the oxide semiconductor layer is formed;

forming a source electrode layer and a drain electrode layer over the oxide semiconductor layer after performing the first heat treatment;

forming an inorganic insulating layer over the oxide semiconductor layer, the source electrode layer, and the drain electrode layer, wherein the inorganic insulating layer entirely covers the source electrode layer and the drain electrode layer;

performing a second heat treatment after the inorganic insulating layer is formed, wherein a temperature of the second heat treatment is lower than a temperature of the first heat treatment, and wherein the oxide semiconductor layer is crystallized after the first heat treatment.

12. The method for manufacturing a semiconductor device according to claim 11, wherein the temperature of the first heat treatment is higher than or equal to 350° C. and lower than or equal to 750° C.

13. The method for manufacturing a semiconductor device according to claim 11, wherein the oxide semiconductor layer comprises indium and zinc.

* * * * *